(12) United States Patent
Arigane et al.

(10) Patent No.: US 8,409,949 B2
(45) Date of Patent: Apr. 2, 2013

(54) NON-VOLATILE SEMICONDUCTOR MEMORY DEVICE AND METHOD OF MANUFACTURING THE SAME

(75) Inventors: Tsuyoshi Arigane, Akishima (JP); Digh Hisamoto, Kokubunji (JP); Yasuhiro Shimamoto, Tokorozawa (JP); Toshiyuki Mine, Fussa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 250 days.

(21) Appl. No.: 12/822,157

(22) Filed: Jun. 23, 2010

(65) Prior Publication Data

US 2010/0261327 A1 Oct. 14, 2010

Related U.S. Application Data

(62) Division of application No. 12/273,308, filed on Nov. 18, 2008, now Pat. No. 7,759,720.

(30) Foreign Application Priority Data

Nov. 22, 2007 (JP) ................................ 2007-303639

(51) Int. Cl.
*H01L 21/336* (2006.01)
(52) U.S. Cl. ........ 438/257; 438/586; 438/589; 438/620; 438/621
(58) Field of Classification Search .................. 438/257, 438/261, 586, 589, 620, 621; 257/E21.409
See application file for complete search history.

(56) References Cited

U.S. PATENT DOCUMENTS

| | | | |
|---|---|---|---|
| 4,870,470 A | 9/1989 | Bass, Jr. et al. | |
| 6,169,307 B1 | 1/2001 | Takahashi et al. | |
| 6,377,490 B1 | 4/2002 | Takahashi et al. | |
| 6,750,504 B2 * | 6/2004 | Yang et al. ..................... | 257/315 |
| 2002/0064071 A1 | 5/2002 | Takahashi et al. | |
| 2003/0111672 A1 | 6/2003 | Cavins et al. | |
| 2004/0159879 A1 | 8/2004 | Hakozaki et al. | |
| 2009/0124080 A1 | 5/2009 | Shigeoka et al. | |
| 2009/0174007 A1 | 7/2009 | Nishimura et al. | |

FOREIGN PATENT DOCUMENTS

| | | |
|---|---|---|
| JP | 01-115165 A | 5/1989 |
| JP | 11-177068 A | 7/1999 |
| JP | 2003-318289 A | 11/2003 |
| JP | 2004-253474 A | 9/2004 |
| JP | 2005-514769 A | 5/2005 |
| JP | 2006-303448 A | 11/2006 |

OTHER PUBLICATIONS

Office Action issued Nov. 20, 2012, in Japanese Patent Application No. 2007-303639.

* cited by examiner

*Primary Examiner* — Jack Chen
(74) *Attorney, Agent, or Firm* — Miles & Stockbridge P.C.

(57) ABSTRACT

Provided is a nonvolatile semiconductor memory device highly integrated and highly reliable. A plurality of memory cells are formed in a plurality of active regions sectioned by a plurality of isolations (silicon oxide films) extending in the Y direction and deeper than a well (p type semiconductor region). In each memory cell, a contact is provided in the well (p type semiconductor region) so as to penetrate through a source diffusion layer ($n^+$ type semiconductor region), and the contact that electrically connects bit lines (metal wirings) and the source diffusion layer ($n^+$ type semiconductor region) is also electrically connected to the well (p type semiconductor region).

1 Claim, 39 Drawing Sheets

| | CG1 | CG2 | CG3 | CG4 | MG1 | MG2 | MG3 | MG4 | Drain1 | Drain2 | Source & well1 | Source & well2 | Source & well3 | Source & well4 |
|---|---|---|---|---|---|---|---|---|---|---|---|---|---|---|
| Program | 0 V | 1 V | 0 V | 0 V | 1.5 V | 10 V | 1.5 V | 1.5 V | 5 V | 5 V | 1.5 V | 1.5 V | 0.5 V | 1.5 V |
| Erase | 0 V | 0 V | 0 V | 0 V | -6 V | -6 V | -6 V | -6 V | 6 V | 6 V | 1.5 V | 1.5 V | 0 V | 1.5 V |
| Read | 0 V | 1.5 V | 0 V | 0 V | 0 V | 0 V | 0 V | 0 V | 1.5 V | 1.5 V | 1.5 V | 1.5 V | 0 V | 1.5 V |

FIG. 18

| | CG1 | CG2 | CG3 | CG4 | MG1 | MG2 | MG3 | MG4 | Drain1 | Drain2 | Source & well1 | Source & well2 | Source & well3 | Source & well4 |
|---|---|---|---|---|---|---|---|---|---|---|---|---|---|---|
| Program | 0 V | 1 V | 0 V | 0 V | 1.5 V | 10 V | 1.5 V | 1.5 V | 5 V | 5 V | 1.5 V | 1.5 V | 0.5 V | 1.5 V |
| Erase | 0 V | 0 V | 0 V | 0 V | -8.5 V | -8.5 V | -8.5 V | -8.5 V | 1.5 V | 1.5 V | 0 V | 0 V | 1.5 V | 0 V |
| Read | 0 V | 1.5 V | 0 V | 0 V | 0 V | 0 V | 0 V | 0 V | 1.5 V | 1.5 V | 1.5 V | 1.5 V | 0 V | 1.5 V |

|  | MG1 | MG2 | MG3 | MG4 | Drain1 | Drain2 | Source & well1 | Source & well2 | Source & well3 | Source & well4 |
|---|---|---|---|---|---|---|---|---|---|---|
| Program | 0 V | 5 V | 0 V | 0 V | 5 V | 5 V | 1.5 V | 1.5 V | 0.5 V | 1.5 V |
| Erase | -6 V | -6 V | -6 V | -6 V | 6 V | 6 V | 1.5 V | 1.5 V | 0 V | 1.5 V |
| Read | 0 V | Vread | 0 V | 0 V | 1.5 V | 1.5 V | 1.5 V | 1.5 V | 0 V | 1.5 V |

FIG. 30

|  | MG1 | MG2 | MG3 | MG4 | Drain1 | Drain2 | Source & well1 | Source & well2 | Source & well3 | Source & well4 |
|---|---|---|---|---|---|---|---|---|---|---|
| Program | 0 V | 10 V | 0 V | 0 V | OPEN | OPEN | 1.5 V | 1.5 V | 0 V | 1.5 V |
| Erase | -8.5 V | -8.5 V | -8.5 V | -8.5 V | 1.5 V | 1.5 V | 0 V | 0 V | 1.5 V | 0 V |
| Read | 0 V | Vread | 0 V | 0 V | 1.5 V | 1.5 V | 1.5 V | 1.5 V | 0 V | 1.5 V |

A − A'

B − B'

C-C'

D-D'

A – A'

B – B'

C – C'

D – D'

NON-VOLATILE SEMICONDUCTOR MEMORY DEVICE AND METHOD OF MANUFACTURING THE SAME

CROSS-REFERENCE TO RELATED APPLICATION

This application is a division of application Ser. No. 12/273,308 filed Nov. 18, 2008. The present application also claims priority from Japanese Patent Application No. JP 2007-303639 filed on Nov. 22, 2007, the content of which is hereby incorporated by reference into this application.

TECHNICAL FIELD OF THE INVENTION

The present invention relates to a nonvolatile semiconductor memory device and a method of manufacturing the same. More particularly, the present invention relates to a technique effectively applied for obtaining high integration and high reliability of memory cells.

BACKGROUND OF THE INVENTION

As one of the integrated semiconductor memories embedded in an LSI, a nonvolatile memory is known. The nonvolatile memory is an element in which memory information is retained even when the LSI is turned off, and accordingly, it is a very important device when the LSI is employed for various applications.

Among nonvolatile memories of semiconductor devices, there are the so-called floating-gate memory and a memory using an insulating film. These memory cells are usually arranged in a matrix, and constitute an array (memory cell array) configured by a plurality of bit lines and word lines for use. Therefore, when a specified voltage is applied onto the bit lines and the word lines in order to program or erase a selected memory cell, a similar voltage gets to be also applied onto unselected memory cells that share the bit lines and the word lines. As a result, there is a possibility that a phenomenon such that a threshold value of the unselected memory cells is changed by the applied voltage, so-called miss-programming and miss-erase (disturbance) may occur.

U.S. Pat. No. 6,750,504 (Patent Document 1) and Japanese Patent Application Laid-Open Publication No. H01-115165 (Patent Document 2), disclose techniques to reduce the miss-programming and miss-erase, in which a well is isolated per bit line, and different voltages are applied onto the wells of selected memory cells for programming or erasing and onto the wells of the unselected memory cells, respectively. Meanwhile, in Patent Documents 1 and 2, power feeding to the well is made via a contact formed at an active edge (well edge).

In addition, in U.S. Pat. No. 4,870,470 (Patent Document 3), an n type diffusion layer (drain) is formed in an n type well, and an n type diffusion layer (source) is formed via a p type well. It is disclosed that the p type well is connected with the n type diffusion layer (source) by a contact that penetrates through the n type diffusion layer (source).

In such memory cells described in Patent Documents 1 and 2 mentioned above, along with reduction of the memory cell size, as the active width (that is, each well width dividing the wells) becomes narrow, the resistance of the well increases, and it is thought that it is hard to supply power from the contact for the wells formed at the active edge. In other words, the effects to reduce the disturbances become different due to the voltage drop in a distance from the contact to the channel region of each memory cell, and accordingly, there is a possibility that the effects to reduce the disturbances may decline extremely, in particular, with respect to the memory cells provided away from the contact may decline extremely.

As countermeasures against the increase of well resistance along with size reduction, in order to supply a desired voltage to the respective wells isolated for each bit line, it is considered to form a plurality of contacts for merely supplying power to the wells with respect to one bit line, and to reduce the number of the memory cells to be connected to one bit line, and so forth. However, by these countermeasures, when arrays including the same number of cells are constituted, the layout areas thereof are increased inevitably.

In addition, against the difference of the voltage drop in a distance from the contact to the channel region of the respective memory cells, in such a memory cell as described in the Patent Document 3 mentioned above, it is considered that, by the contact that penetrates through to the wells to the n type diffusion layer (source), the voltage can be supplied not by power supply to the well from the active edge, but at the vicinity of the memory cells. However, because the n type well conductive with the n type diffusion layer (drain) covers the p type well, junction leakage at the time of reading increases.

SUMMARY OF THE INVENTION

The object of the present invention is to provide an art that can make a nonvolatile semiconductor memory device highly integrated and highly reliable.

The above and other objects and novel characteristics of the present invention will be apparent from the description of this specification and the accompanying drawings.

The typical ones of the inventions disclosed in this application will be briefly described as follows.

In an embodiment of the present invention, a plurality of memory cells are arranged in matrix in an X direction and in a Y direction intersecting the X axis of a main surface of a semiconductor substrate, and the memory cells are formed in a plurality of active regions sectioned by a plurality of isolations (device isolations) formed deeper than the p type wells and extending in the Y direction. Each memory cell has a drain diffusion layer (n type semiconductor region) and a source diffusion layer (n type semiconductor region) formed in the p type well, and a contact is provided in the p type well so as to penetrate through the source diffusion layer. The contact electrically connects the bit lines and the source diffusion layer, and is also electrically connected to the p type well.

The effects obtained by typical aspects of the present invention will be briefly described below.

According to an embodiment of the present invention, it is possible to make a nonvolatile semiconductor memory device highly integrated and highly reliable.

BRIEF DESCRIPTIONS OF THE DRAWINGS

FIG. 15 is a table showing operation voltage conditions of a memory cell according to the first embodiment;

FIG. 18 is a table showing operation voltage conditions of a memory cell according to a second embodiment;

FIG. 29 is a table showing operation voltage conditions of a memory cell according to the first embodiment;

FIG. 30 is a table showing operation voltage conditions of a memory cell according to a fourth embodiment;

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Also, in some drawings used in the embodiments, hatching is used even in a plan view so as to make the drawings easy to see.

First Embodiment

Figure 1:
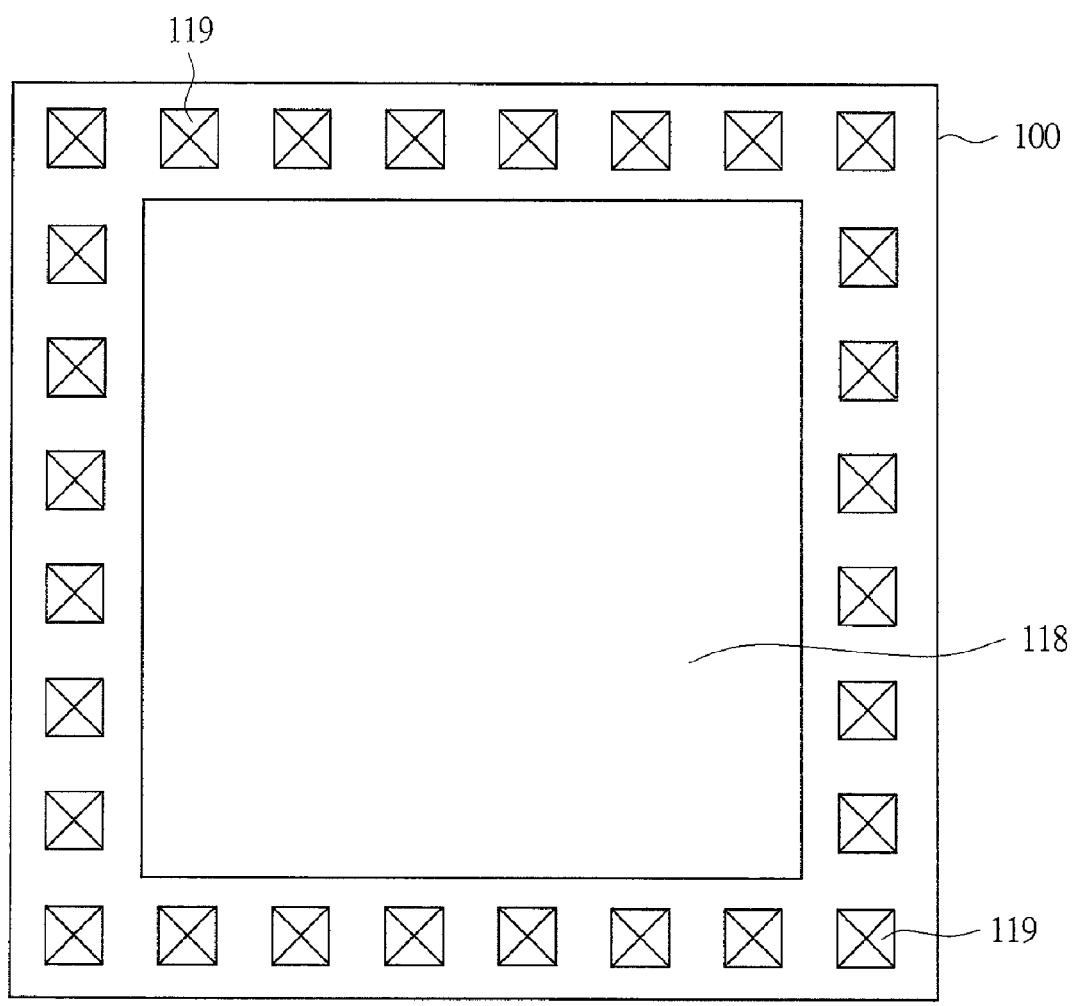
FIG. 1 is a plan view of a nonvolatile semiconductor memory device according to a first embodiment.
Figure 2:
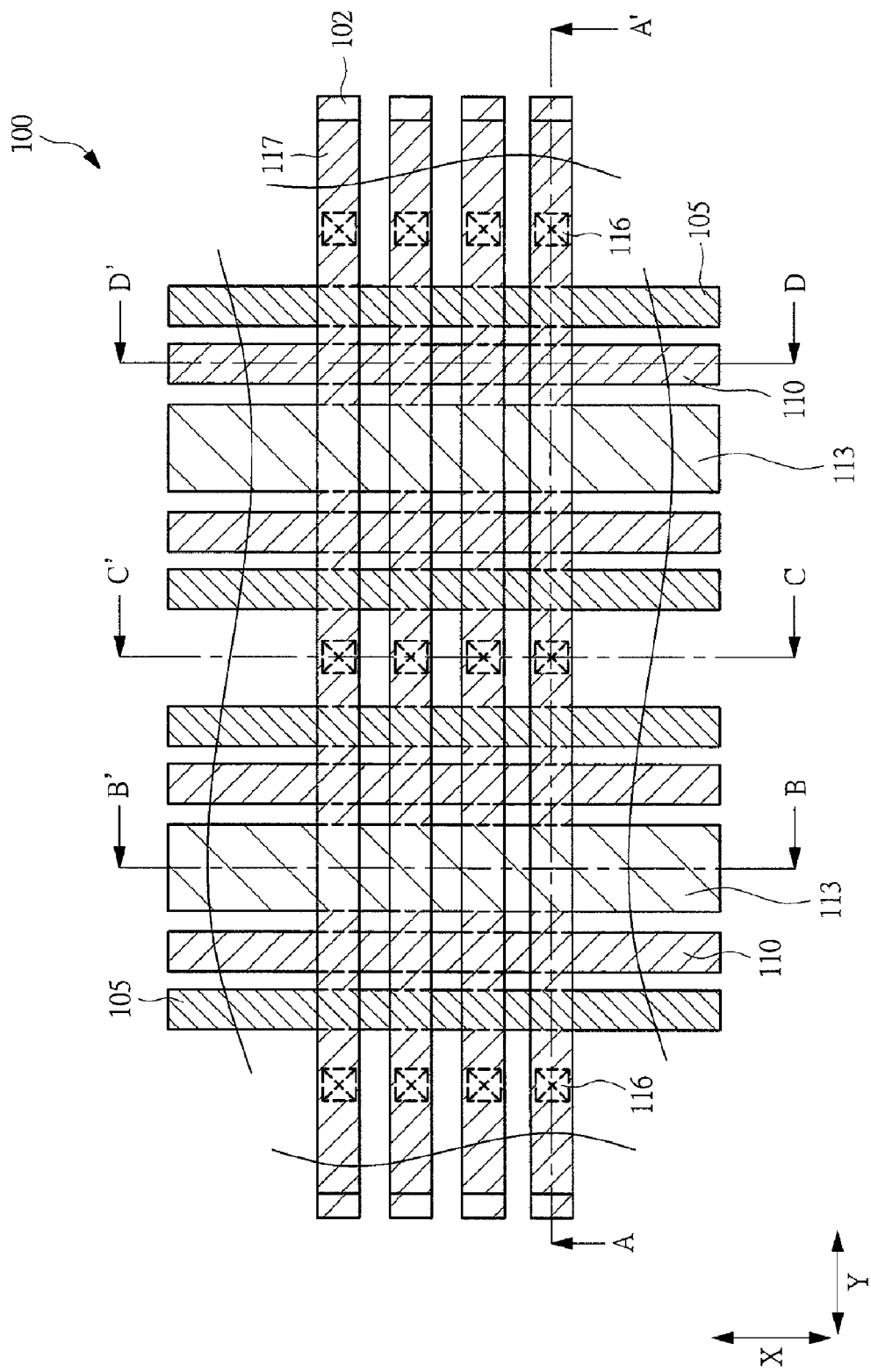
FIG. 2 is a plan view of main parts showing a memory cell array shown in FIG. 1.
Figure 3:
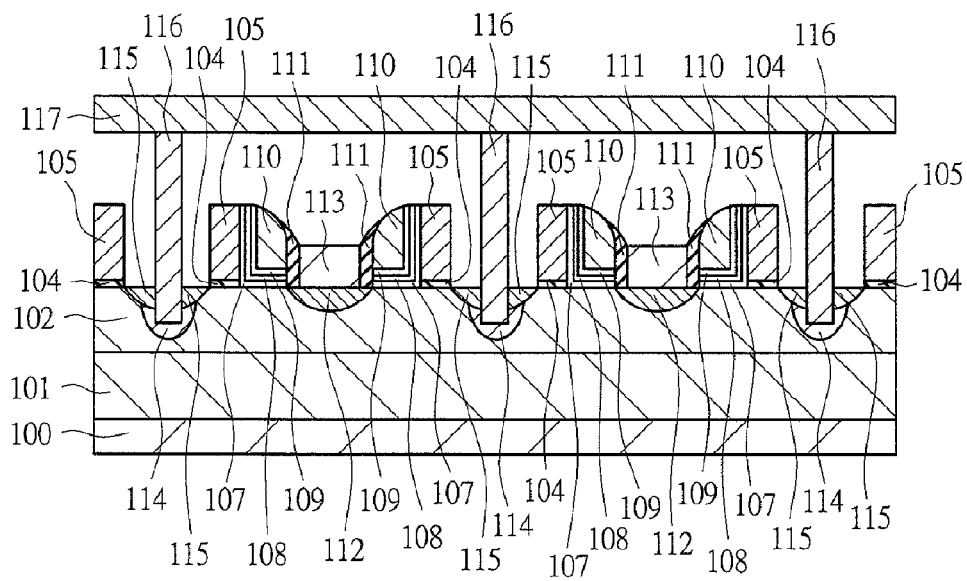
FIG. 3 is a cross-sectional view taken along the A-A' line of FIG. 2.
Figure 4:
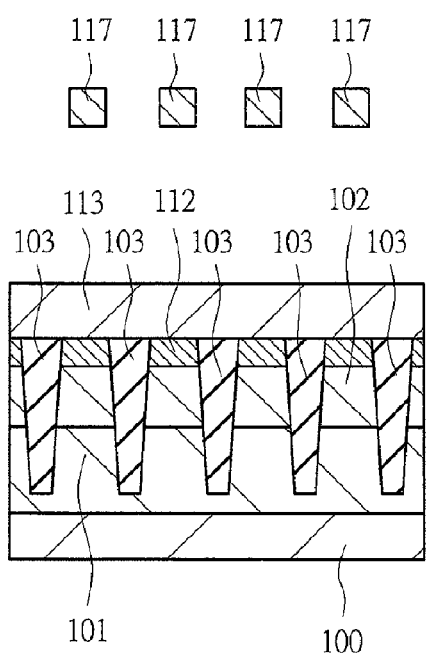
FIG. 4 is a cross-sectional view taken along the B-B' line of FIG. 2.
Figure 5:
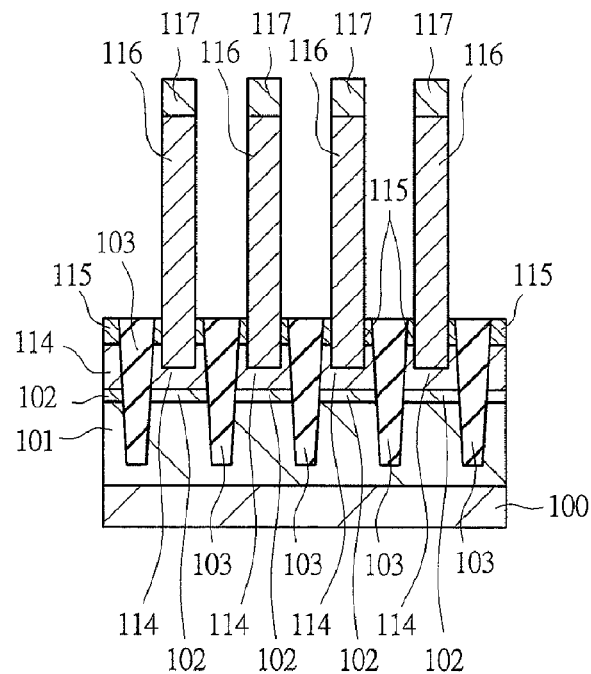
FIG. 5 is a cross-sectional view taken along the C-C' line of FIG. 2.
Figure 6:
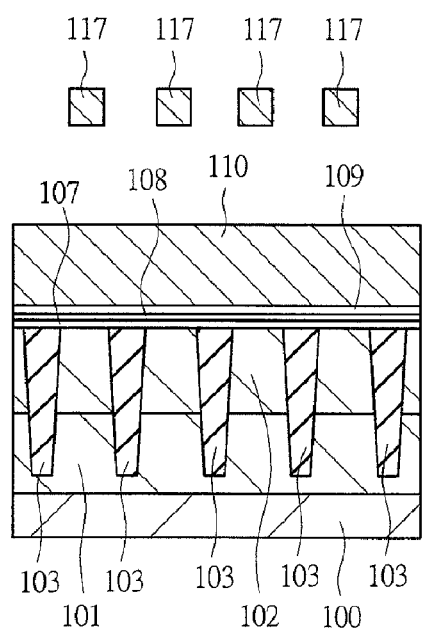
FIG. 6 is a cross-sectional view taken along the D-D' line of FIG. 2.

FIG. 1 is a plan view of a semiconductor substrate showing an example of a nonvolatile semiconductor memory device according to the present embodiment, and FIG. 2 is a plan view of main parts showing a memory cell array shown in FIG. 1, and FIG. 3 to FIG. 6 are cross-sectional views of the semiconductor substrate taken along the A-A' line, B-B' line, C-C' line, and D-D' line in FIG. 2, respectively. In addition, FIG. 7 is an equivalent circuit diagram of the memory cell array corresponding to FIG. 2.

The plurality of memory cells of the present embodiment are arranged in an array region 118 of a main surface of a semiconductor substrate (for example, a silicon substrate 100) as shown in FIG. 1. In the outside of the array region 118, a plurality of contacts 119 to supply power to an n type semiconductor region 101 formed to a deep location from the main surface of the silicon substrate 100 (for example, refer to FIG. 3) are arranged. In addition, the n type semiconductor region 101 will be fixed to a specified voltage via this contact 119.

Figure 7:
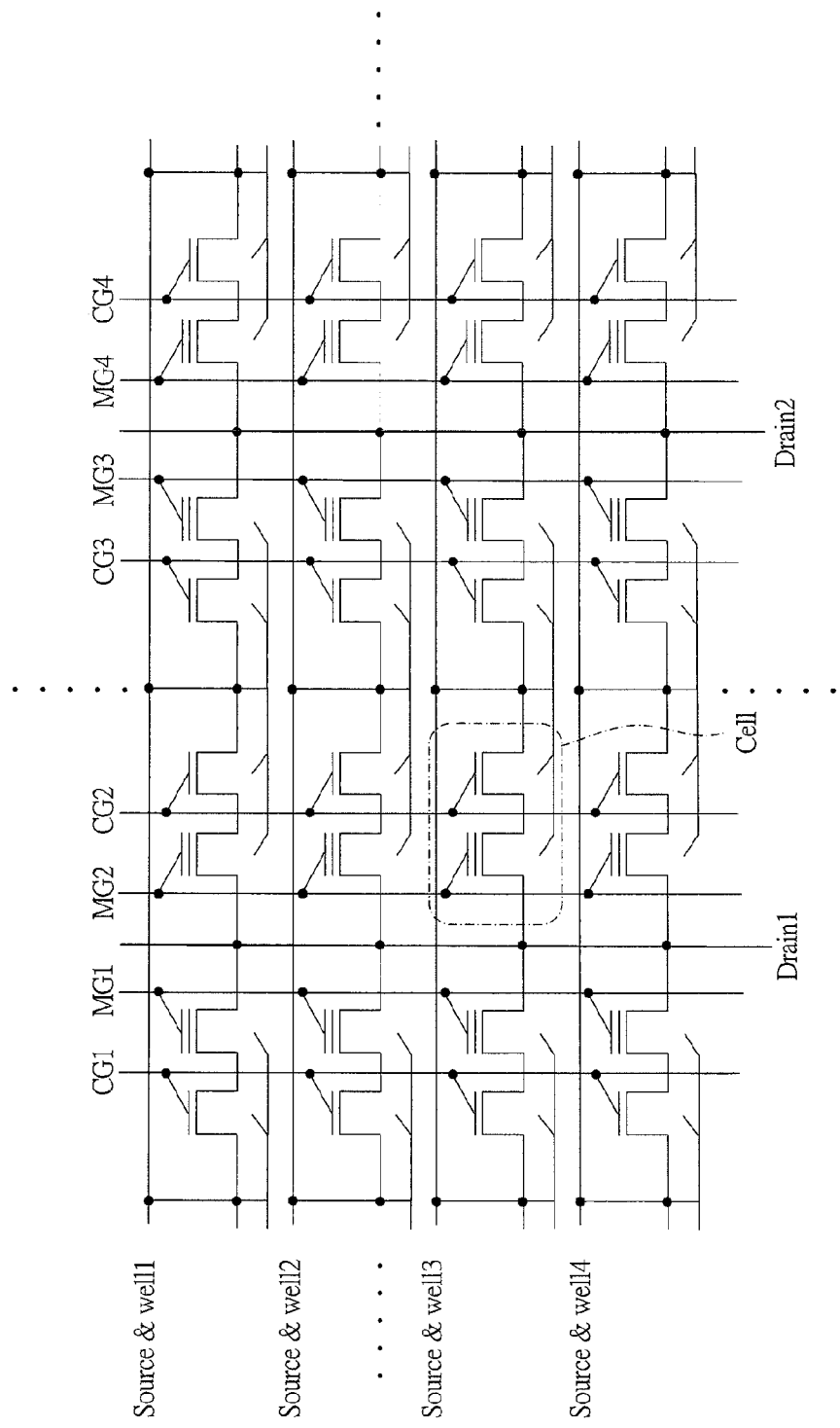
FIG. 7 is an equivalent circuit diagram of the memory cell array shown in FIG. 2.

In the array region 118, as shown in FIG. 7, a plurality of memory cells are arranged in matrix. One memory cell includes two field effect transistors that use one well in common. In FIG. 7, wirings MGs (1, 2, . . . ) that are electrically connected to memory gates of the field effect transistors at one side, and wirings CGs (1, 2, . . . ) that are electrically connected to select gates of the field effect transistors at the other side are shown. This wiring CG constitutes a so-called word line. In addition, wirings Drains (1, 2, . . . ) that are electrically connected to a drain diffusion layer of the memory cell, and wirings Source&wells (1, 2, . . . ) that are electrically connected to the source diffusion layer and the well are shown. In the present embodiment, since the drain diffusion layer and the source diffusion layer are formed in this well and the source diffusion layer and the well are electrically connected, it is denoted as wiring Source&well. This wiring Source&well shows so-called a bit line, and the wiring Drain shows so-called a data line.

As shown in FIG. 2 to FIG. 6, the memory cell includes: an n type semiconductor region 101 formed on a main surface of a silicon substrate 100 having an X direction (row direction) and a Y direction (column direction) intersecting the X direction; a p type semiconductor region 102 constituting a well formed above the n type semiconductor region 101; a polysilicon film 105 constituting a gate for selecting any one of a plurality of memories (select gate); and a polysilicon film 110 constituting a gate for determining whether there is memory (information) by a threshold value (memory gate). The p type semiconductor region 102 is isolated into a plurality of active regions by the n type semiconductor region 101 and an isolation (for example, a silicon oxide film 103). Further, in the present embodiment, between the well (p type semiconductor region 102) and the n type semiconductor region 101, a specified voltage is applied on the n type semiconductor region 101 through the contact 119, so that they are electrically isolated to suppress leakage current.

The silicon oxide film 103 constituting this isolation is disposed to extend in the Y direction, and may be formed, for example, by STI (Shallow Trench Isolation) so as to be deeper than the well (p type semiconductor region 102) in a narrow region and so as to cover the upper part of the n type semiconductor region 101. In addition, in the present embodiment, the plurality of active regions are isolated in the form of plane stripes by a plurality of isolations (silicon oxide films 103) extending in the Y direction. Therefore, the active regions are isolated for respective bit lines, and it is possible to apply different voltages on the wells of the program/erase selected memory cells and the active regions of the non-selected memory cells respectively.

The polysilicon film 105 constituting the select gate and the well (p type semiconductor region 102) are insulated by a silicon oxide film 104 constituting a gate insulating film. The section between the polysilicon film 110 constituting the memory gate and the well (p type semiconductor region 102) is insulated by a stacked-layer film formed by an ONO (Oxide-Nitride-Oxide) film in which a silicon nitride film 108 to become a charge accumulation film is sandwiched by a silicon oxide film 107 (bottom film) and a silicon oxide film 109 (top film). In addition, the polysilicon film 105 constituting the select gate and the polysilicon film 110 constituting the memory gate are insulated by this ONO film.

The polysilicon film 105 constituting the select gate is connected in the X direction of the main surface of the silicon substrate 100, and forms the word line. The polysilicon film 110 constituting the memory gate is connected in the X direction in parallel with the select gate. A metal wiring 117 constituting the bit line is disposed extending in the Y direction. In addition, an $n^+$ type semiconductor region 112 constituting each drain diffusion layer of the plurality of memory cells is electrically connected by the data line (polysilicon film 113) extending in the X direction.

Therefore, the plurality of memory cells are arranged in the matrix state along the X direction and the Y direction of the main surface of the silicon substrate 100, and the respective select gates thereof are electrically connected by the word line (polysilicon film 105) extending in the X direction, and the respective source diffusion layers ($n^+$ type semiconductor regions 115) are electrically connected by the bit line (metal wiring 117) in the Y direction. In addition, this bit line (metal wiring 117) is arranged on the active region sectioned by the isolation (silicon oxide film 103) mentioned above. Therefore, it may be said that devices are isolated for each bit line.

The source diffusion layers ($n^+$ type semiconductor regions 115) in the same active region are connected by the metal wiring 117 that constitutes a bit line through the contact 116. In addition, this contact 116 is arranged to penetrate through the $n^+$ type semiconductor region 115 in the well (p type semiconductor region 102), and it is to supply electricity to the well. In the present embodiment, in order to reduce the contact resistance between the contact 116 and the well (p type semiconductor region 102), a $p^+$ type semiconductor region 114 whose impurity density is higher than that of the well (p type semiconductor region 102) is arranged in the lower part of the $n^+$ type semiconductor region 115, and electrically connects the well and the contact 116 through the p+ type semiconductor region 114.

In order to further reduce the contact resistance, the contact surface of the p type semiconductor region 102 to come in contact with the contact 116 may be silicided. In the present embodiment, for example, in the connection of the contact 116 shown in FIG. 3 and FIG. 5, the contact surface of the source diffusion layer (n+ type semiconductor region 115) and the contact surface of the p+ type semiconductor region 114 to come in contact with the contact 116 are silicided.

The n+ type semiconductor region 112 to become the drain diffusion layer of the memory cell is electrically connected to the adjacent n+ type semiconductor region 112 interposing the isolation (silicon oxide film 103) by, for example, a polysilicon film 113 as a wiring conductive film formed above the upper part of the n+ type semiconductor region 112. In the present embodiment, as mentioned above, the active region is sectioned in the shape of stripes by the isolations extending in the Y direction. On this account, it is necessary to connect the respective drain diffusion layers (n+ type semiconductor regions 112) of memory cells arranged in the X direction electrically to constitute a memory cell array. Therefore, the wiring conductive film (polysilicon film 113) is provided on the drain diffusion layer (n+ type semiconductor region 112) and the isolation (silicon oxide film 103), so that the drain diffusion layers (n+ type semiconductor regions 112) of the respective memory cells arranged in the X direction are electrically connected.

The plurality of memory cells of the present embodiment include: a field effect transistor having the p type semiconductor region 102 constituting the well, the memory gate (polysilicon film 110) disposed on the p type semiconductor region 102 interposing the ONO film; and the n+ type semiconductor region 112 and the n+ type semiconductor region 115 that are arranged on the well (p type semiconductor region 102) so as to sandwich a channel region at a lower part of the memory gate so that the drain/source of the memory cell is constituted.

More concretely, the memory cell includes: the select gate (polysilicon film 105) disposed on the well (p type semiconductor region 102) interposing the gate insulating film (silicon oxide film 104); the ONO film disposed on the sidewalls of the select gate and along the p type semiconductor region 102; and the memory gate (polysilicon film 110) that is disposed on the p type semiconductor region 102 interposing the ONO film and arranged adjacent to the select gate (polysilicon film 105) interposing the ONO film. The memory cell includes the drain diffusion layer (n+ type semiconductor region 112) under the sidewalls of the memory gate (polysilicon film 110), and the source diffusion layer (n+ type semiconductor region 115) under the sidewalls of the select gate (polysilicon film 105).

In the memory cell of the present embodiment, the contact 116 is provided in the well (p type semiconductor region 102) so as to penetrate through the source diffusion layer (n+ type semiconductor region 115). In other words, the contact 116 that electrically connects the bit wiring (metal wiring 117) and the source diffusion layer (n+ type semiconductor region 115) is also electrically connected to the well (p type semiconductor region 102). Therefore, it is possible to perform power supply to the well in the vicinity of the channel region of each memory cell. In other words, it is possible to perform power supply to the well in a state with small losses due to the resistance of the active region.

Meanwhile, when the power supply to the well is performed at the active edge (well edge), in particular, when power supply to the well is performed at the active edge in a state where the resistance of the active region is increased by the narrowed active width along with the size reduction of the memory cell, there is a possibility that the effects to reduce disturbances may be declined extremely by the voltage drop in the distance from the contact to the channel region. However, in the nonvolatile semiconductor memory device of the present embodiment, power supply to the well is performed at the vicinity of the channel region of each memory cell, and accordingly, it is possible to perform power supply to the well in the state with small losses due to the resistance of the active region.

More concretely, for example, by supplying power to the drain diffusion layer (n+ type semiconductor region 112) of the memory cell electrically connected to the same data line as the selected memory cell selected as an object of programming, from the contact 116 electrically connected to the source diffusion layer (n+ type semiconductor region 115) of the memory cell, the potential difference between the well and the drain diffusion layer becomes small, and accordingly, it is possible to prevent miss-programming (disturbances).

In addition, in the case where the contact for power supply to the well is merely provided, a region to connect the contact and well must be secured in the active region so as to perform power supply to the well in the vicinity of the channel region of each memory cell. However, in the nonvolatile semiconductor memory device of the present embodiment, the contact 116 to electrically connect the source diffusion layer (n+ type semiconductor region 115) and the bit wiring (metal wiring 117) is electrically connected to the well (p type semiconductor region 102), and thus it is possible to suppress the increase of resistance of the active region.

Therefore, in the nonvolatile semiconductor memory device of the present embodiment, the memory cell can be formed in a specified active region, and accordingly, it is possible to make the device highly integrated, and the disturbances can be prevented, thereby making the device highly reliable.

Next, a manufacturing method of the nonvolatile semiconductor memory device according to the present embodiment will be explained with reference to the attached drawings. FIG. 8 to FIG. 14 are cross-sectional views of a nonvolatile semiconductor memory device during its manufacturing steps taken along the A-A' line, B-B' line, C-C' line, and D-D' line of FIG. 2.

Figure 8:
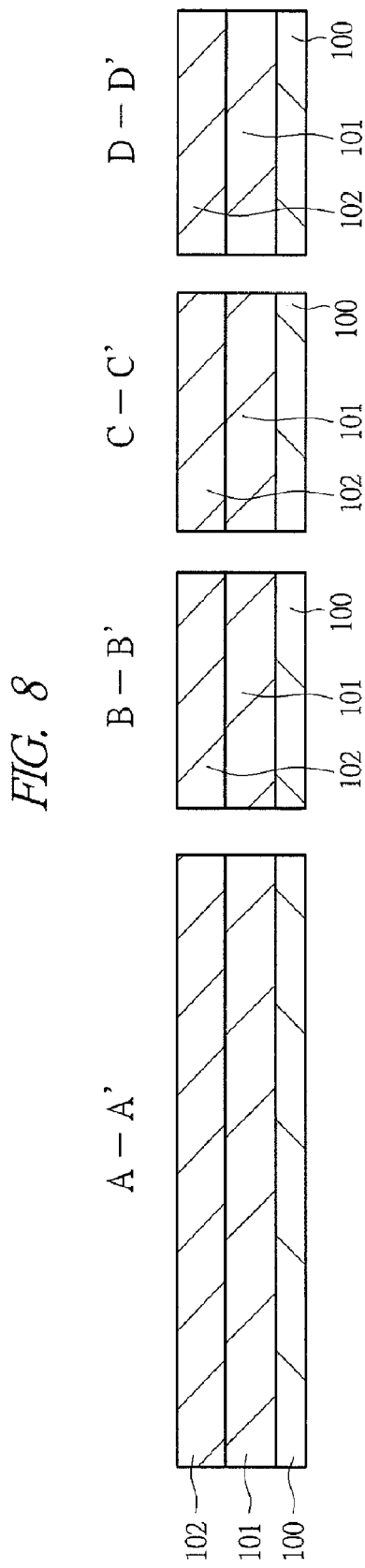
FIG. 8 is a cross-sectional view showing a method of manufacturing the memory cell region of the nonvolatile semiconductor memory device according to the first embodiment.

First, a semiconductor substrate (silicon substrate 100 made of, for example, p type single crystal silicon) having the X direction and the Y direction intersecting the X direction shown in FIG. 2 is prepared, and then, on the main surface of the semiconductor substrate, the n type semiconductor region 101 and the p type semiconductor region 102 constituting the well are formed by lithography and ion implantation technology (FIG. 8). Since the p type semiconductor region 102 is used as an active region, the n type semiconductor region 101 and the p type semiconductor region 102 are formed to have opposite conductive types to each other so that they are electrically isolated.

Figure 9:
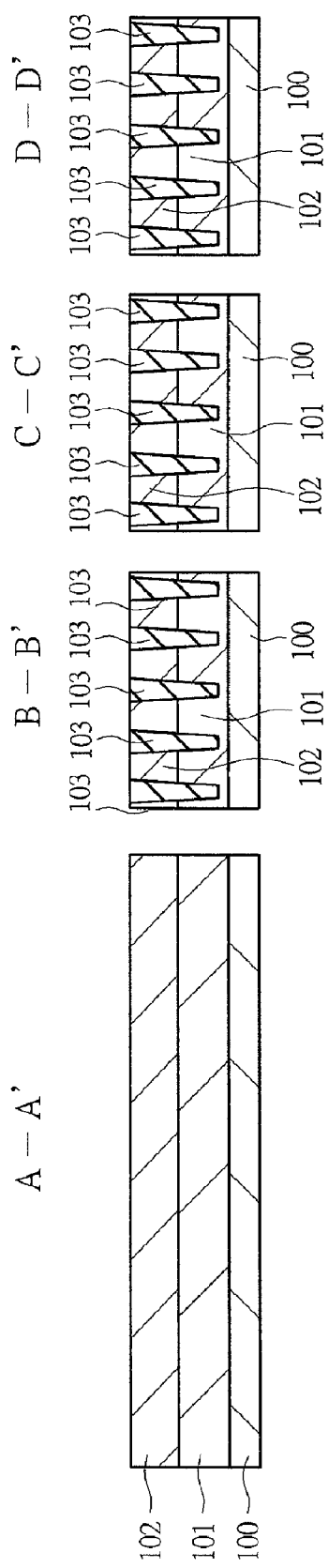
FIG. 9 is a cross-sectional view showing the method of manufacturing the nonvolatile semiconductor memory device continued from FIG. 8.

Thereafter, by use of lithography and dry etching, on the main surface of the silicon substrate 100, a plurality of trenches extending in the Y direction are formed along the X direction and deeper than the p type semiconductor region 102, and then a silicon oxide film 103 is buried into the above trenches by a CVD (Chemical Vapor Deposition) method, and the silicon oxide film 103 deposited on the silicon substrate 100 is removed by a CMP (Chemical Mechanical Polishing) technology (FIG. 9). Thereby, the plurality of isolations (silicon oxide films 103) extending in the Y direction are formed along the X direction as STI.

Figure 10:
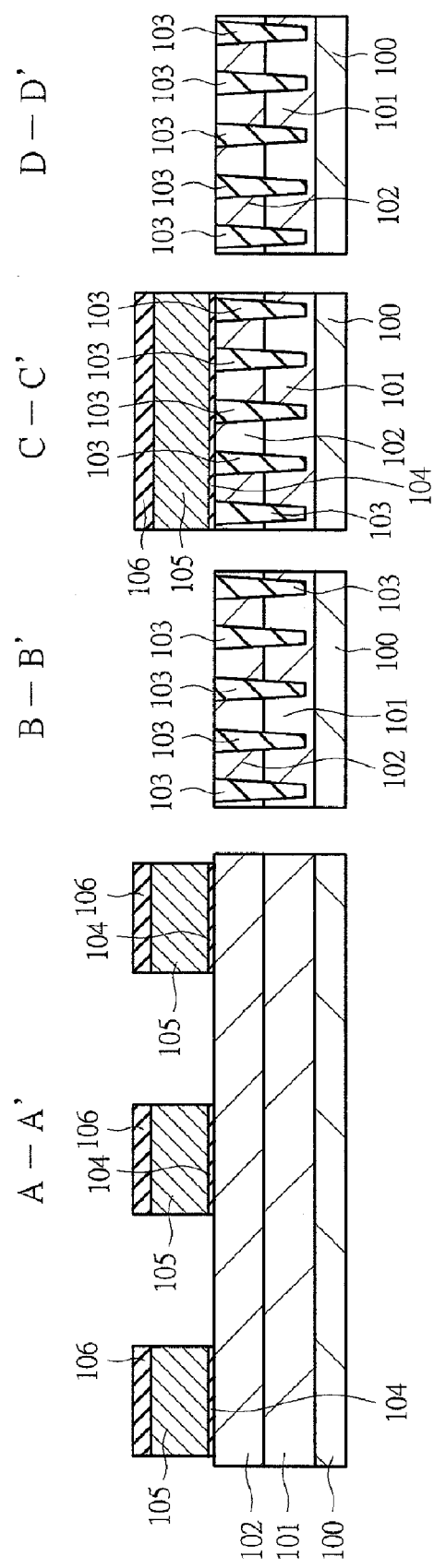
FIG. 10 is a cross-sectional view showing the method of manufacturing the nonvolatile semiconductor memory device continued from FIG. 9.

Subsequently, a silicon oxide film 104 to become the gate oxide film of the select gate is formed by a thermal oxidation method, and the polysilicon film 105 to become the select gate, and a silicon oxide film 106 are deposited, and then the regions to become the memory gate and the drain diffusion layer are removed by etching (FIG. 10).

Figure 11:
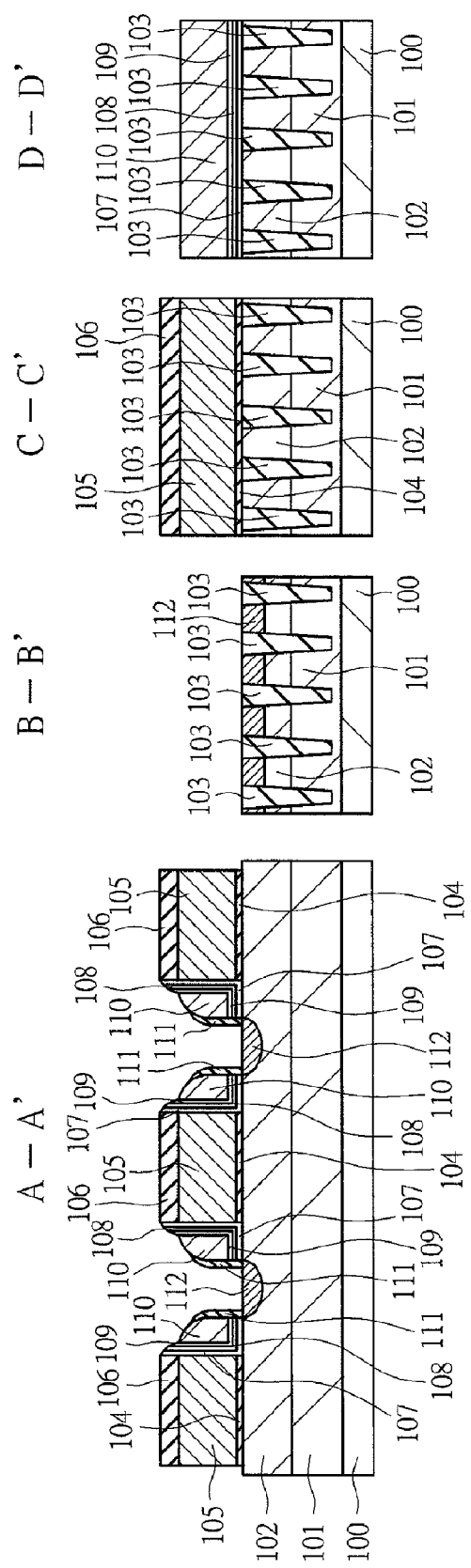
FIG. 11 is a cross-sectional view showing the method of manufacturing the nonvolatile semiconductor memory device continued from FIG. 10.
Figure 12:
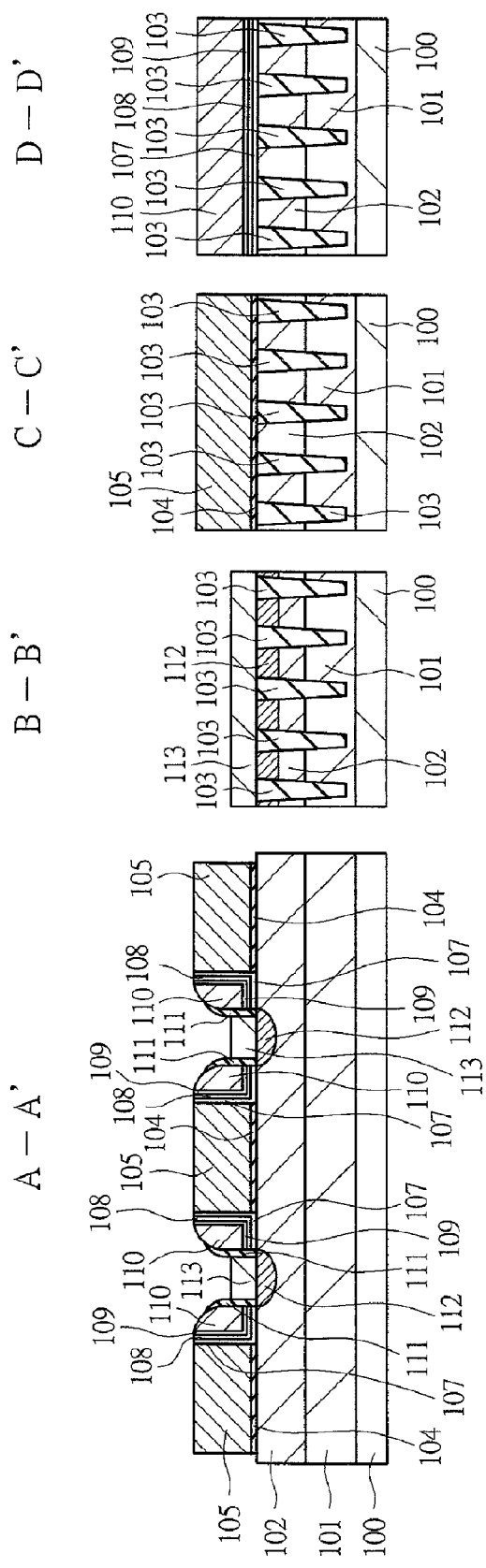
FIG. 12 is a cross-sectional view showing the method of manufacturing the nonvolatile semiconductor memory device continued from FIG. 11.

Subsequently, a polysilicon film 110 of a conductive film for the gate constituting the memory gate is formed interposing the ONO film on the main surface of the silicon substrate 100, and the polysilicon film 110 is patterned so as to extend in the X direction, and the sidewalls of the silicon oxide film 111 are formed, and an $n^+$ type semiconductor region 112 to become a drain diffusion layer is formed by ion implantation (FIG. 11). The abovesaid ONO film is constituted by forming the silicon oxide film 107 by a thermal oxidation method, depositing the silicon nitride film 108 to become a charge accumulation film, and forming the silicon oxide film 109 by oxidizing partly. In addition, the abovesaid memory gate is formed by depositing the polysilicon film 110 so as to cover the ONO film, and then processing the sidewalls.

Subsequently, the polysilicon film 113 which is a wiring conductive film to constitute the data line is formed on the main surface of the silicon substrate 100, and the polysilicon film 113 is patterned so as to extend in the X direction (FIG. 12) on the $n^+$ type semiconductor region 112 and the silicon oxide film 103 that, is the isolation. More concretely, the $n^+$ type semiconductor region 112 is exposed completely on the surface by cleaning, and then the polysilicon film 113 to connect adjacent active regions is deposited, and the polysilicon film 113 is left only between adjacent memory gates by, for example, an etch-back method.

Figure 13:
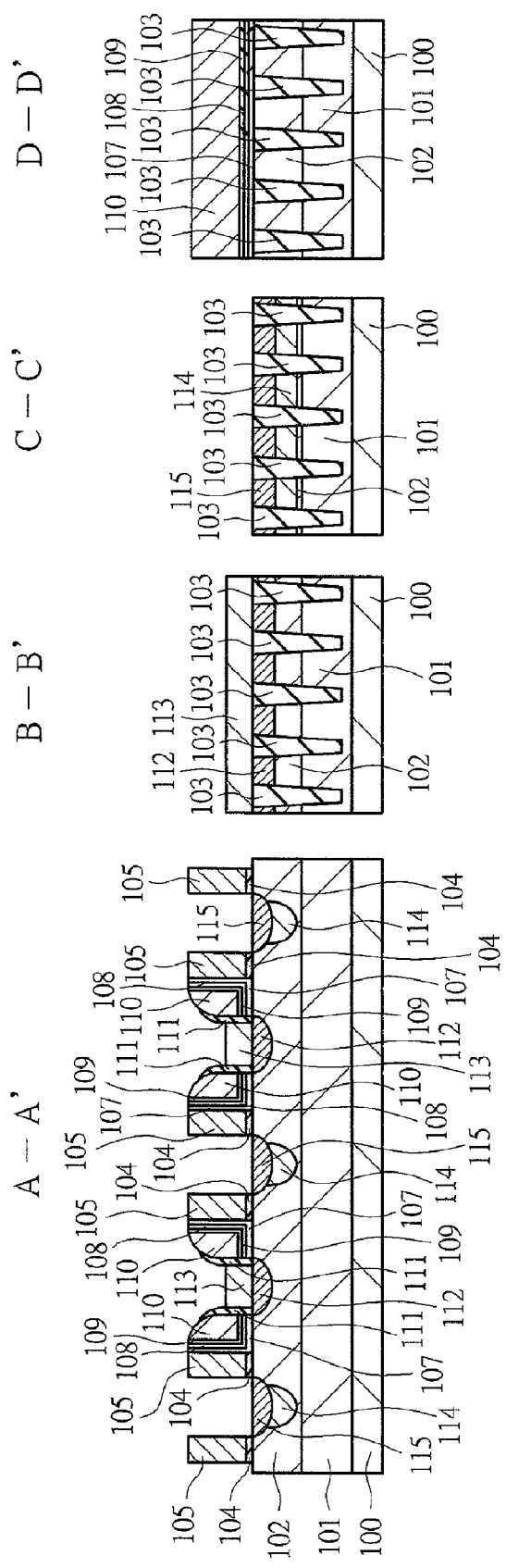
FIG. 13 is a cross-sectional view showing the method of manufacturing the nonvolatile semiconductor memory device continued from FIG. 12.

Subsequently, as shown in FIG. 13, a select gate consisting of the polysilicon film 105 is formed by lithography and etching technology, and then, in the well (p type semiconductor region 102) under the sidewalls of the abovesaid select gate, the $p^+$ type semiconductor region 114 whose impurity concentration is higher than that of the p type semiconductor region 102 is formed, and further, the $n^+$ type semiconductor region 115 constituting the source diffusion layer is formed. More concretely, to the p type semiconductor region 102 that is exposed by the patterning of the polysilicon film 105 when the abovesaid select gate is formed, the $p^+$ type semiconductor region 114 to become a voltage applied area of the contact 116 for the well (p type semiconductor region 102) and the $n^+$ type semiconductor region 115 to become the source diffusion layer are formed by ion implantation. In addition, after the select gate is formed, the polysilicon film 105 (select gate), the polysilicon film 110 (memory gate), and the polysilicon film 113 (wiring conductive film of the data line) may be sidewall to reduce each resistance.

While these $p^+$ type semiconductor region 114 and $n^+$ type semiconductor region 115 are formed in the well (p type semiconductor region 102) on the sidewall side of the select gate (polysilicon film 105), it may be said that they are formed in the well (p type semiconductor region 102) on the sidewall side of the memory gate (polysilicon film 110) next to the select gate. In other words, the $n^+$ type semiconductor region 112 is formed on one side of sidewalls of the memory gate (polysilicon film 110), and the $n^+$ type semiconductor region 115 is formed on the other side of the sidewalls.

Figure 14:
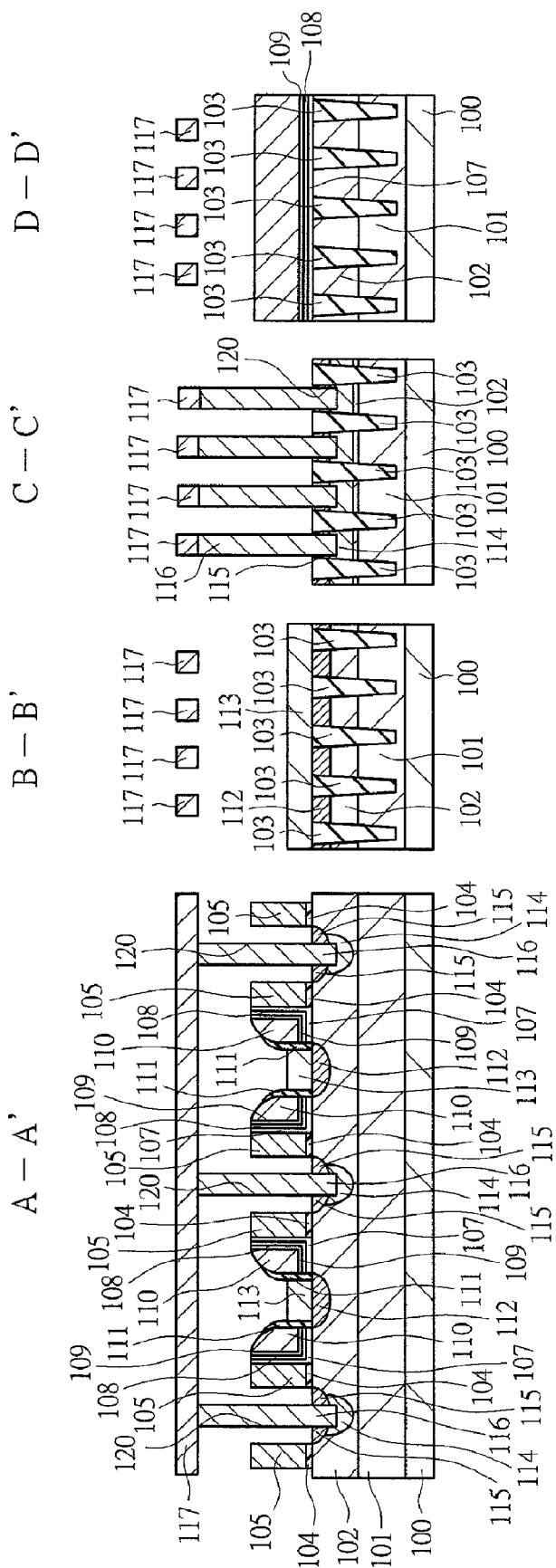
FIG. 14 is a cross-sectional view showing the method of manufacturing the nonvolatile semiconductor memory device continued from FIG. 13.

Subsequently, for example, after a silicon oxide film (not illustrated) as an interlayer insulating film is deposited on the silicon substrate 100 by a CVD method, a hole (contact hole 120) that penetrates through the abovesaid interlayer insulating film and the $n^+$ type semiconductor region 115 to reach the $p^+$ type semiconductor region 114 is formed by lithography and etching technology in the p type semiconductor region 102 (FIG. 14). Thereafter, the surfaces of the p type semiconductor region 102 ($p^+$ type semiconductor region 114 and the $n^+$ type semiconductor region 115) exposed by the contact hole 120 may be silicided. In concrete, for example, a nickel film is formed on the side of the contact hole 120, and exposed the p type semiconductor region 102 and the above nickel film are made to react by a heat treatment, and then unreacted nickel film is removed, thereby the surface of the p type semiconductor region 102 exposed by the contact hole 120 is silicided.

Subsequently, a metal film (for example, a tungsten film) is buried in the contact hole 120 so that the contact 116 that is electrically connected to the $n^+$ type semiconductor region 115 and the p type semiconductor region 102 is formed, and then, a metal film (for example, a film formed mainly of aluminum) is deposited, and patterned, and the metal wiring 117 to constitute a bit line is formed (FIG. 14). Thereafter, for example, by forming an insulating film, and a passivation film covering the bit line, the nonvolatile semiconductor memory device is completed.

In the nonvolatile semiconductor memory device manufactured through the above steps, since the contact 116 to supply power to the source diffusion layer ($n^+$ type semiconductor region 115) and the well (p type semiconductor region 102) is used in common for each bit line (metal wiring 117), there is no need to form another contact hole for the well (p type semiconductor region 102), and in comparison with the prior art, it is possible to reduce the layout area. Furthermore, since power can be supplied from the contact 116 of each memory cell to the well (p type semiconductor region 102), even if the active width is reduced by the reduction of memory cell size, it is possible to supply power to the well (p type single conductor region 102).

Next, an example of applied voltage conditions at the time of reading, erasing, and programming operations in the memory cell array according to the present embodiment is shown in a table of FIG. 15, and the respective operations are explained with reference to a circuit diagram of FIG. 7. In addition, 1.5V is always applied on the n type semiconductor region 101 so as to prevent a leakage current during the memory cell operations.

In the reading operation, for example, in the case to select one memory cell of the memory cell array (the selected cell: Cell in FIG. 7), as shown in the table of FIG. 15, 1.5V is applied to the wiring CG2' (selected word line), 0V is applied to the wiring MG2, 1.5V is applied to the wirings Drain1 and Drain2, and 0V is applied to the wiring Source&well3 (selected bit line), so that the threshold value of the memory cell is judged. At this moment, 0V is applied to the wirings CG1, CG3, and CG4 and wirings MG1, MG3, and MG4. In addition, 1.5V is applied to the wirings Source&well1, Source&well2, and Source&well4 which are unselected bit lines. Since the potential difference between the source and the drain of the unselected bit lines is 0V under this condition, it is possible to completely suppress the leakage current in the reading operation. In addition, in the unselected cells of the wiring Source&well3, the off-leakage current is controlled by applying 0V to the wirings CG1, CG3, and CG4.

The erase operation is performed in unit of bit line, and the plurality of cells are erased at the same time. As the voltage condition, 0V is applied to wirings CG 1 to CG4, −6V is applied to the wirings MG1 to MG4, 6V is applied to the wiring Drain1 and Drain2, and 0V is applied to the wiring Source&well3 which is the selected bit line. At this moment, for example, a strong inversion occurs in the region where the memory gate (polysilicon film 110) at the end of the drain diffusion layer ($n^+$ type semiconductor region 112) shown in FIG. 3 and the diffusion layer are overlapping so that a band-to-band tunneling phenomenon is induced, and it is possible to form a hole. The hole occurred is accelerated to the channel direction, and is pulled by the bias of the memory gate (polysilicon film 110), and injected into the ONO film, thereby performing the erase operation. In other words, it is possible to reduce the threshold value of the memory gate which has been increased by the charges of the electrons by the charges of the injected holes. Note that, under the condition described above, the selected state is made by applying 0V only to the wiring Source&well3, however, by applying the selection voltage to the plurality of wiring Source&wells, it is possible to further enlarge the unit of erasing, and also it is possible to improve the throughput of the erase operation.

As mentioned above, in the present embodiment, the contact 116 that connects the bit wiring (metal wiring 117) and the source diffusion layer ($n^+$ type semiconductor region 115) electrically is connected also to the well (p type semiconductor region 102) electrically. On this account, by applying 1.5V to the wirings Source&well1, Source&well2, and Source&well4 which are unselected bit lines, it is possible to make the potential difference between the drain ($n^+$ type semiconductor region 112) and the well (p type semiconductor region 102) small in comparison with a selected bit line, and it is possible to reduce the miss-erase to the cell connected to the unselected bit lines at the time of the erase operation. In addition, since the leakage current flowing in the unselected cell can be decreased, it is possible to lower the power supply necessary for the erase operation and reduce the chip area.

In the programming operation, for example, in the case to select one memory cell of the memory cell array (the selected cell "Cell" in FIG. 7), 1V is applied to the wiring CG2 (selected word line), 10V is applied to the wiring MG2, 5V is applied to the wirings Drain1 and Drain2, and 0.5V is applied to the wiring Source&well3 (selected bit line). Under this voltage condition, for example, a strong electric field is generated in the channel region of the source diffusion layer ($n^+$ type semiconductor region 115) side under the memory gate (polysilicon film 110) shown in FIG. 3 and hot electrons are generated in the same region, and electrons are injected to the charge accumulation film (silicon nitride film 108) (source side injection hot electron programming method), thereby accordingly increasing the threshold of the memory cell. The features of the hot electron injection by this method are that it is possible to inject the hot electrons efficiently by a comparatively small amount of channel current, and that the injection is made intensively at the select gate's side end portion of the memory gate because the electric field is concentrated in the vicinity of the border between the select gate (polysilicon film 105) and the memory gate (polysilicon film 110) that constitute a split gate. In addition, electrons are retained in an extremely small region because these are accumulated in the silicon nitride film 108. Note that, under the condition mentioned above, only the wiring Source&well3 is made into its select state by applying 0.5V, but it is possible to program the memory cells in parallel by applying the selection voltage to the plurality of wirings Source&wells, and it is also possible to improve the programming throughput.

As mentioned above, in the present embodiment, the contact 116 that electrically connects the bit wiring (metal wiring 117) and the source diffusion layer ($n^+$ type semiconductor region 115) is also electrically connected to the well (p type semiconductor region 102). On this account, by applying 0V to the wirings CG1, CG3, and CG4 to be in the unselected state, 1.5V to the wirings MG1, MG3, and MG4, and 1.5V to the wirings Source&well 1, Source&well2, and Source&well4, it is possible to make the potential difference between the drain ($n^+$ type semiconductor region 112) and the well (p type semiconductor region 102) small in comparison with a selected bit line, and it is possible to reduce the miss-erase to the cell connected to the unselected bit line at the time of the erase operation.

Figure 16:
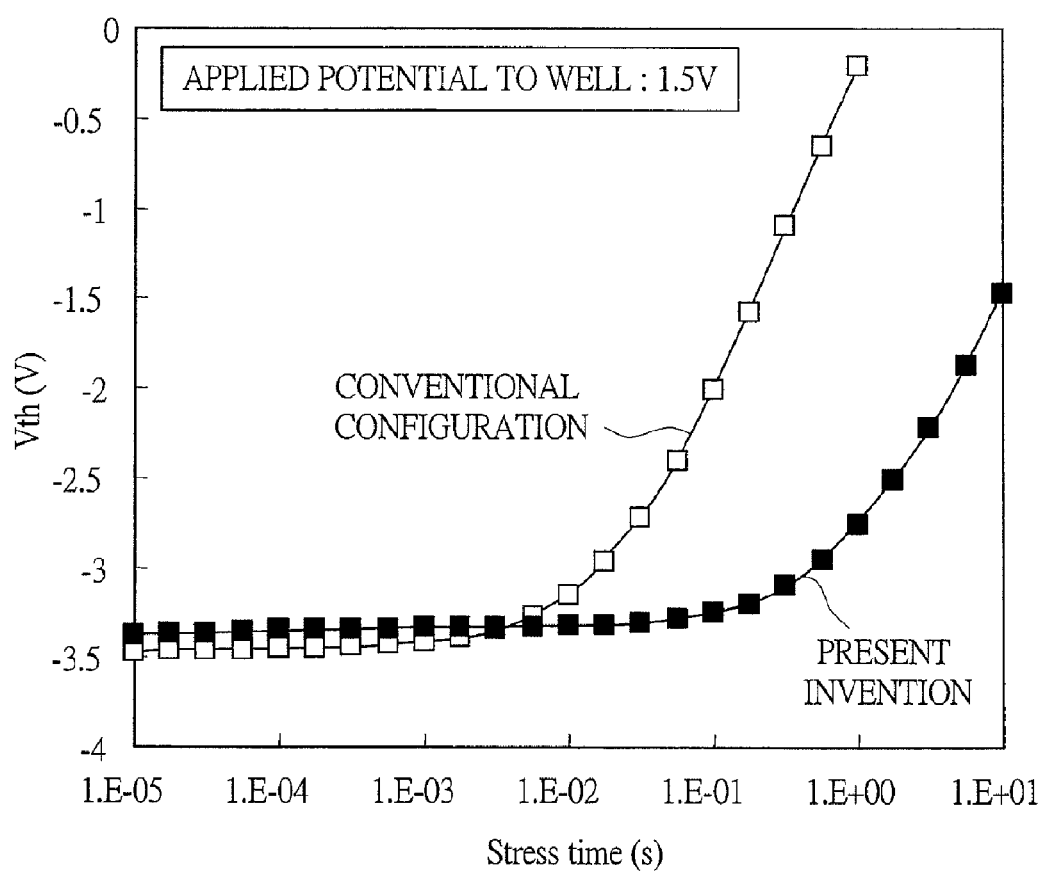
FIG. 16 is a diagram showing a miss-programming (disturbance) tolerance according to the first embodiment in comparison with a conventional configuration.

Herein, the miss-programming tolerance of the memory cell connected to the wiring Source&well2 (unselected bit line) of FIG. 7 in the case, for example, where the resistance of the well (p type semiconductor region 102) is increased by the size reduction is shown in FIG. 16 with a comparison with the conventional configuration. Herein, in the conventional configuration, separately from the contact that is connected to the source diffusion layer, a contact for the well is provided, and the contact for the well is used in common by the plurality of memory cells. In addition, the resistance of the well is assumed to become around mega ohms. As is clear from FIG. 16, in the present invention, since power is supplied to the well (p type semiconductor region 102) through the contact 116 of each memory cell from the bottom of the source diffusion layer ($n^+$ type semiconductor region 115), a desired voltage is applied onto the well, thereby improving the disturbance tolerance.

Figure 17:
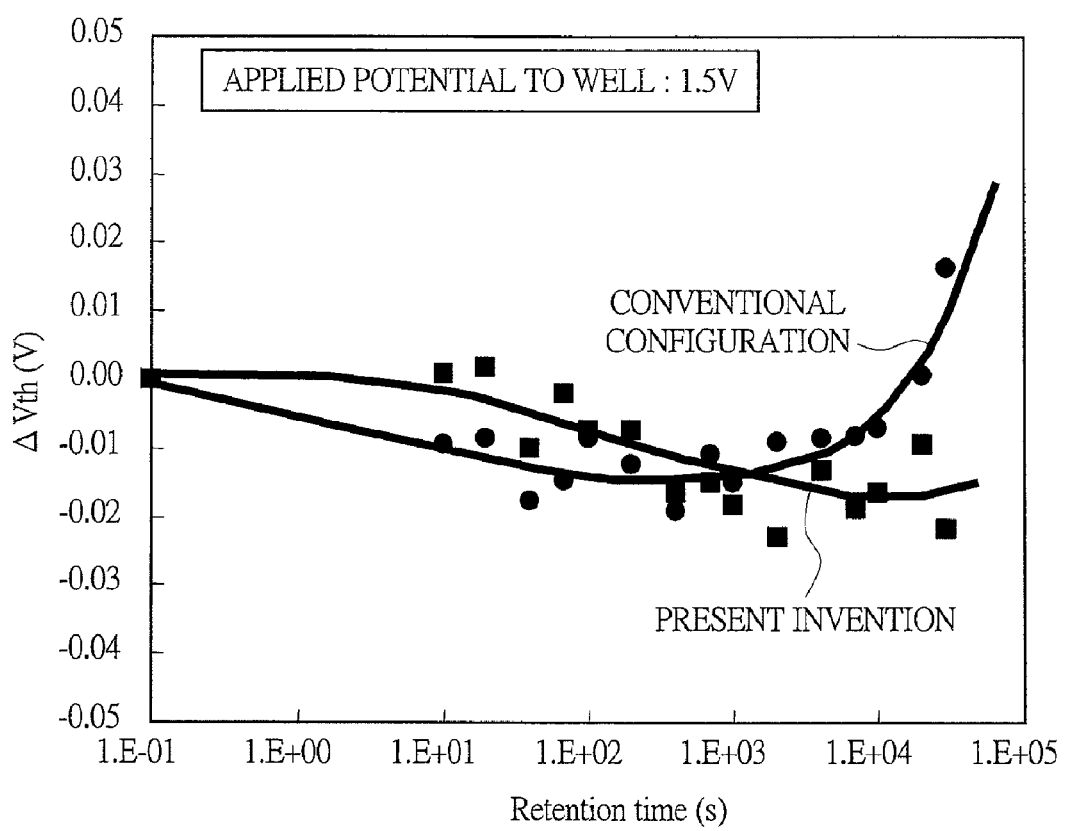
FIG. 17 is a diagram showing a data maintenance characteristic according to the first embodiment in comparison with the conventional configuration.

In addition, a data maintenance characteristic of the memory cell according to the present embodiment is shown in FIG. 17. The figure shows the data maintenance characteristic (time dependence on threshold value change) of the memory cell in the erasing state after rewriting the plurality of cells constituting an array for 10,000 times. It shows the dependency of the voltage to be applied to the well (p type semiconductor region 102) and the source diffusion layer type semiconductor region 115) when the memory cell becomes to the unselected state. As is clear from FIG. 17, by making the voltage to be applied to the well and the source diffusion layer to 1.5V, hot carriers are accumulated in the charge accumulation film (silicon nitride film 108) further stably at the time of rewriting the array, and the retention characteristic is improved.

As mentioned above, in the nonvolatile semiconductor memory device shown in the present embodiment, it is possible to supply power to the wells isolated for each bit line without increasing the layout area, and to reduce the disturbances of the unselected cells. Further, it is possible to improve the data retention characteristic. Furthermore, since the leakage current in the unselected cells can be reduced at the time of the erase operation, it is possible to reduce the power source area and the chip area.

Second Embodiment

A difference between a second embodiment and the first embodiment lies in the erase operation of the memory cell. In the first embodiment, the hot hole induced by the band-to-band tunneling is injected to the charge accumulation film (silicon nitride film 108), so that data is erased; meanwhile, in the second embodiment, the erase operation is performed by the F-N (Fowler-Nordheim) tunneling. The circuit diagram and the manufacturing method in the second embodiment are same as those in the first embodiment.

The memory cell operation voltage condition of the second embodiment is shown in FIG. 18. Herein, the case to erase bit lines one after another in the same manner as in the first embodiment is shown as an example. When the erase selected bit line is assumed to be the Source&well3 in the circuit diagram shown in FIG. 7, 1.5V is applied to the Source&well3, and 0V is applied to other unselected bit lines (Source&well1, Source&well2, and Source&well4). In addition, 1.5V is applied to the wirings Drain1 and Drain2. When −8.5V is applied to all the wirings MGs in this state, in the memory cell arranged in the selected bit line (for example, Cell of FIG. 7), a potential difference of (−8.5V)−(1.5V)=−10V occurs, while a potential difference of only (−8.5V)−(0V)=−8.5V occurs in the cell of the unselected bit line. As a result, in the nonvolatile semiconductor memory device disclosed in the second embodiment, the same effects as in the first embodiment are obtained.

In addition, while an example in which the number of the erase selected bit lines is one is shown in the second embodiment, the plurality of bit lines as a selection condition may be erased at the same time.

Third Embodiment

Figure 19:
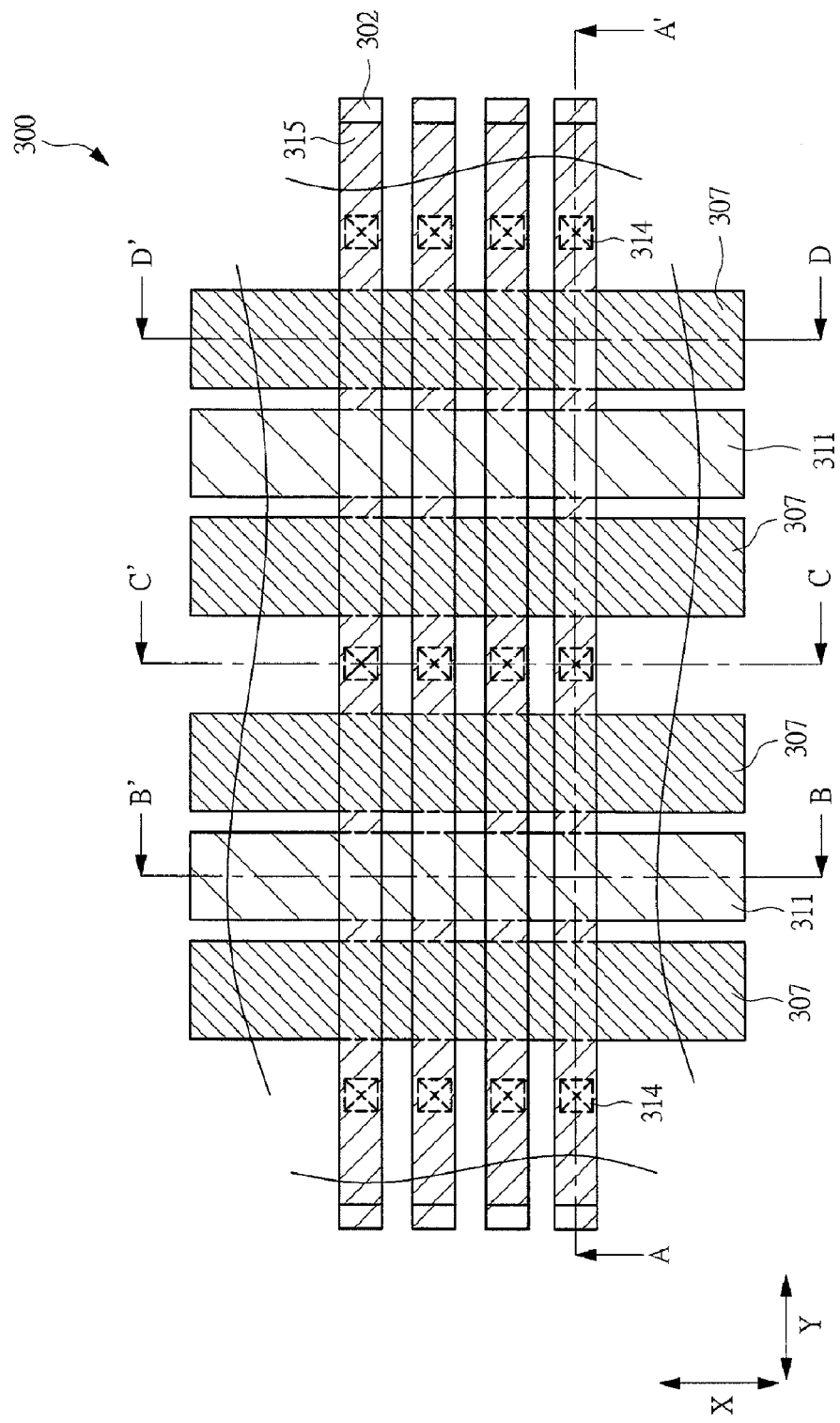
FIG. 19 is a plan view of main parts showing a memory cell of a nonvolatile semiconductor memory device according to a third embodiment.
Figure 20:
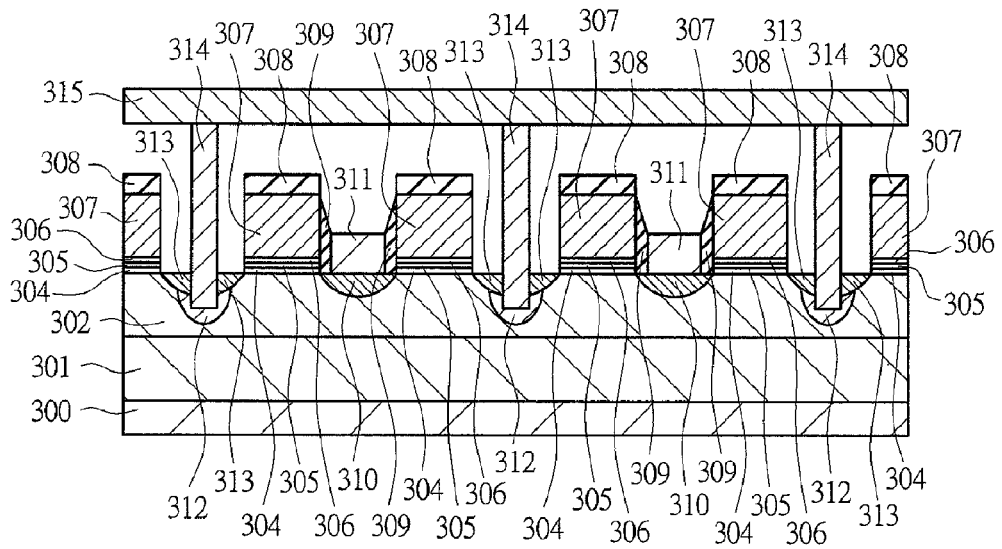
FIG. 20 is a cross-sectional view taken along the A-A' line of FIG. 19.
Figure 21:
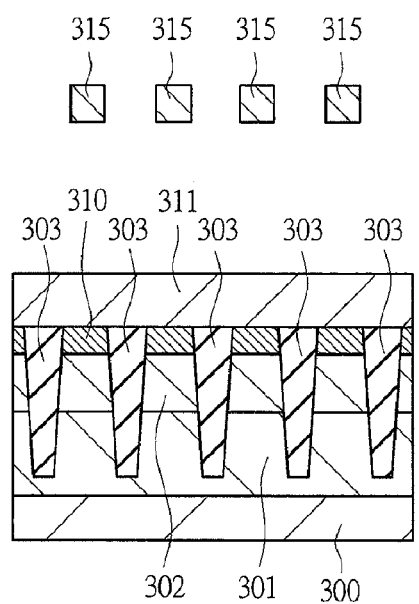
FIG. 21 is a cross-sectional view taken along the B-B' line of FIG. 19.
Figure 22:
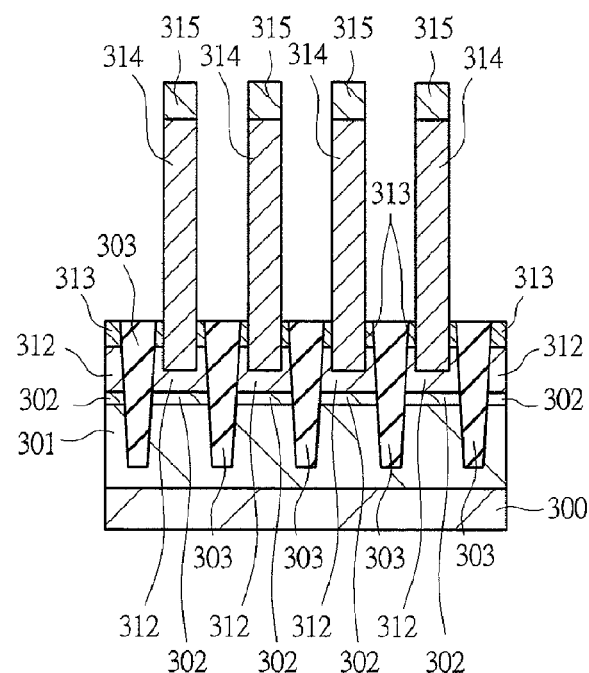
FIG. 22 is a cross-sectional view taken along the C-C' line of FIG. 19.
Figure 23:
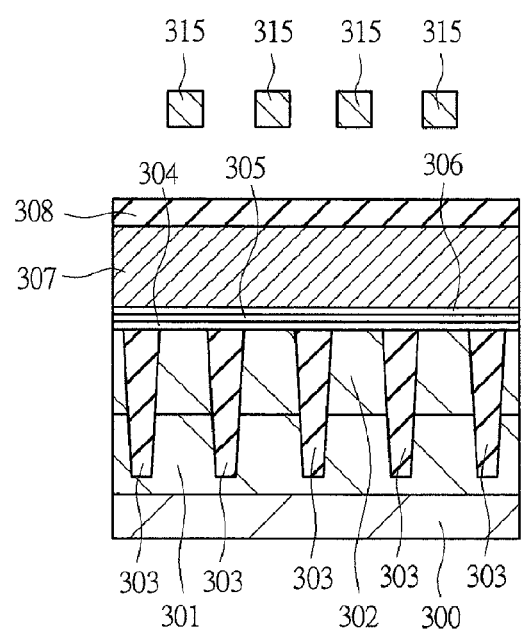
FIG. 23 is a cross-sectional view taken along the D-D' line of FIG. 19.

In a third embodiment, a case in which the constitution of the present invention is applied to an NROM will be described. FIG. 19 is a plan view of main parts of a semiconductor substrate showing an example of a nonvolatile semiconductor memory device according to the third embodiment, and FIG. 20 to FIG. 23 are cross-sectional views of the semiconductor substrate taken along the line, B-B' line, C-C' line, and D-D' line in FIG. 19, respectively. In addition, FIG. 24 is an equivalent circuit diagram corresponding to FIG. 19.

Figure 24:
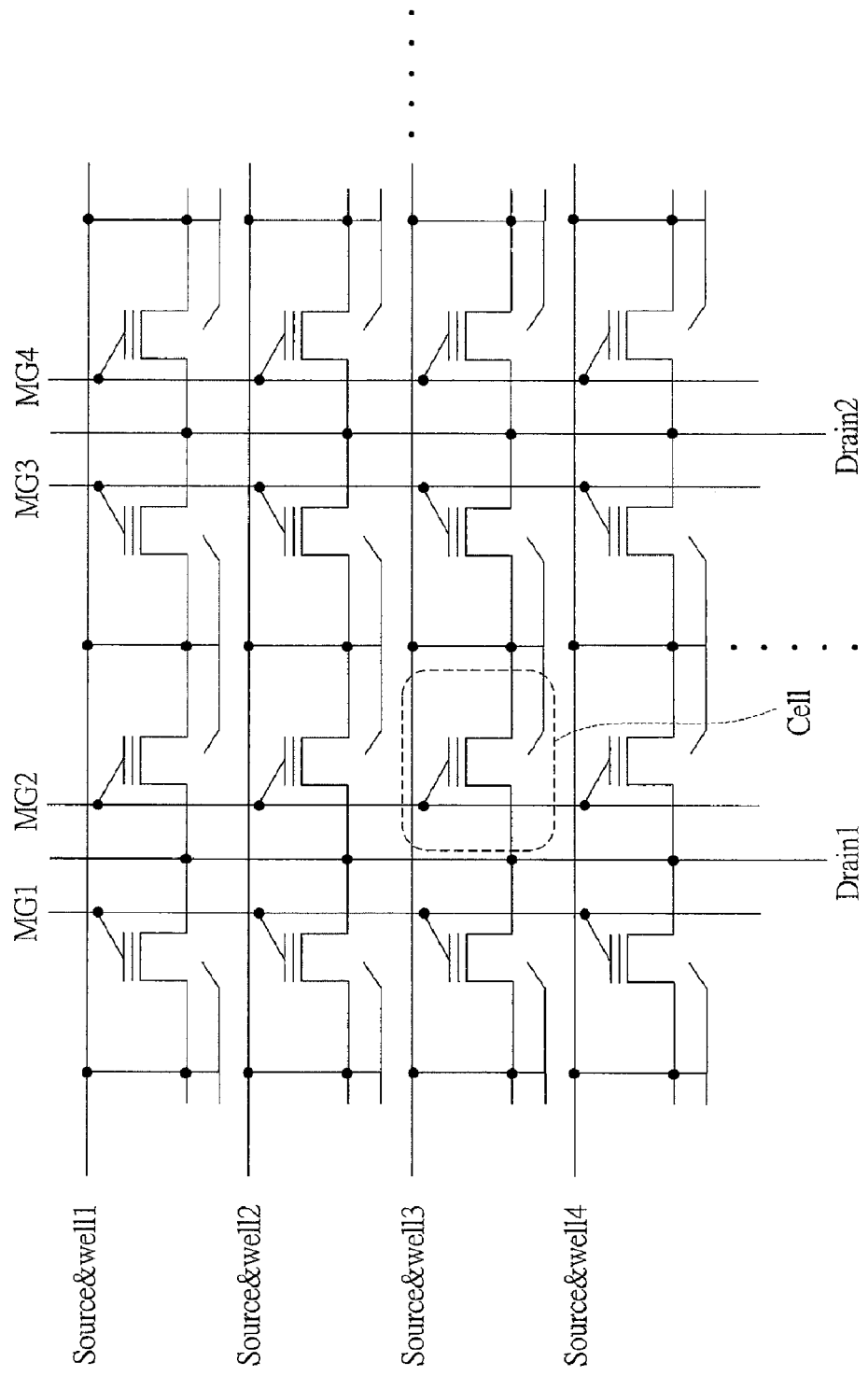
FIG. 24 is an equivalent circuit diagram of the memory cell array shown in FIG. 19.

In FIG. 24, wiring MG (1, 2, . . . ) to be connected to the memory gate of one field effect transistor electrically, wiring Drains (1, 2, . . . ) to be connected to the drain diffusion layer of the memory cell electrically, and wiring Source&wells (1, 2, . . . ) to be electrically connected to the source diffusion layer and the well, are shown. In the present embodiment, since the drain diffusion layer and the source diffusion layer are formed in this well, and the source diffusion layer and the well are electrically connected, they are shown as a wiring Source&well. This wiring Source&well shows a so-called bit line, and the wiring Drain shows a so-called data line.

The plurality of memory cells of the present embodiment are configured by an field effect transistor including: a p type semiconductor region 302 constituting the well; a memory gate (polysilicon film 307) disposed on an upper portion of the p type semiconductor region 302 through an ONO film; and an type semiconductor region 310 and an n$^+$ type semiconductor region 313 arranged in the well (p type semiconductor region 302) to sandwich the channel region of the bottom of the memory gate and constitute the drain/source of the memory cells.

The memory cell of the present embodiment has an n type semiconductor region 301 formed on a main surface of a silicon substrate 300, the p type semiconductor region 302 to become a well formed on the upper part of the n type semiconductor region 301, and the memory gate 307. The p type semiconductor region 302 is isolated by an isolation (silicon oxide film 303) and the n type semiconductor region 301 into each active region. In addition, the n type semiconductor region 301 is formed to reach the lower part of the silicon oxide film 303.

This memory cell is configured by the memory gate 307 arranged interposing the ONO film on the well (p type semiconductor region 302), the drain diffusion layer (n$^+$ type semiconductor region 310) arranged in the well (p type semiconductor region 302) under one side of sidewalls of the memory gate 307, and the source diffusion layer (n$^+$ type semiconductor region 313) arranged in the well (p type semiconductor region 302) under the other side of the sidewalls of the memory gate 307.

The section between the memory gate 307 and the p type semiconductor region 302 is insulated by the ONO insulating film (stacked film) in which a silicon nitride film 305 to become the charge accumulation film is sandwiched by the silicon oxide films 304 and 306. The n$^+$ type semiconductor region 310 to become the drain diffusion layer is connected to the drain diffusion layer region of the bit line to be adjacent to a polysilicon film 311 formed on the upper part thereof. In addition, the n$^+$ type semiconductor region 313 to become the source diffusion layer is connected to the source diffusion layer of the memory cell connected in the same active region by a contact 314 and a metal wiring 315. The contact 314 is formed to penetrate through to a p$^+$ type semiconductor region 312 formed in the lower part of the n$^+$ type semiconductor region 313, and it supplies power to the p type semiconductor region 302 to be the well through the p$_+$ type semiconductor region 312. In addition, the memory gate 307 is connected in the row direction (X direction) to form a word line. The metal wiring 315 to be the bit line is arranged in the column direction (Y direction) that is perpendicular to the word line, thereby constituting a memory cell array.

FIG. 25 to FIG. 28 are cross-sectional views of main parts simply showing a method of manufacturing the nonvolatile semiconductor memory device according to the third embodiment.

Figure 25:
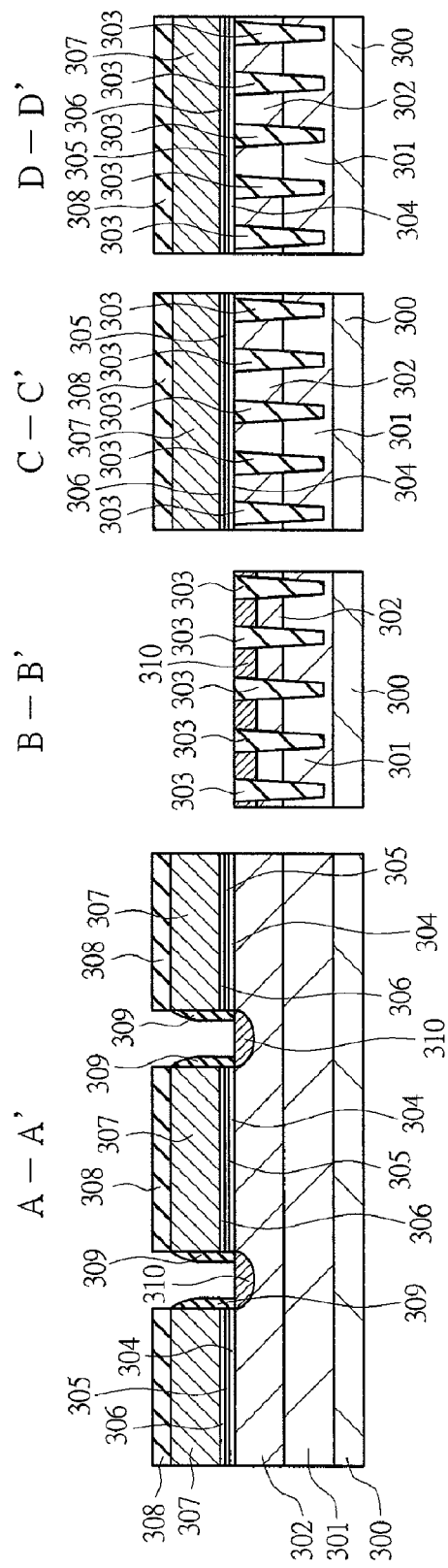
FIG. 25 is a cross-sectional view showing a method of manufacturing a memory cell region of the nonvolatile semiconductor memory device according to the third embodiment.
Figure 26:
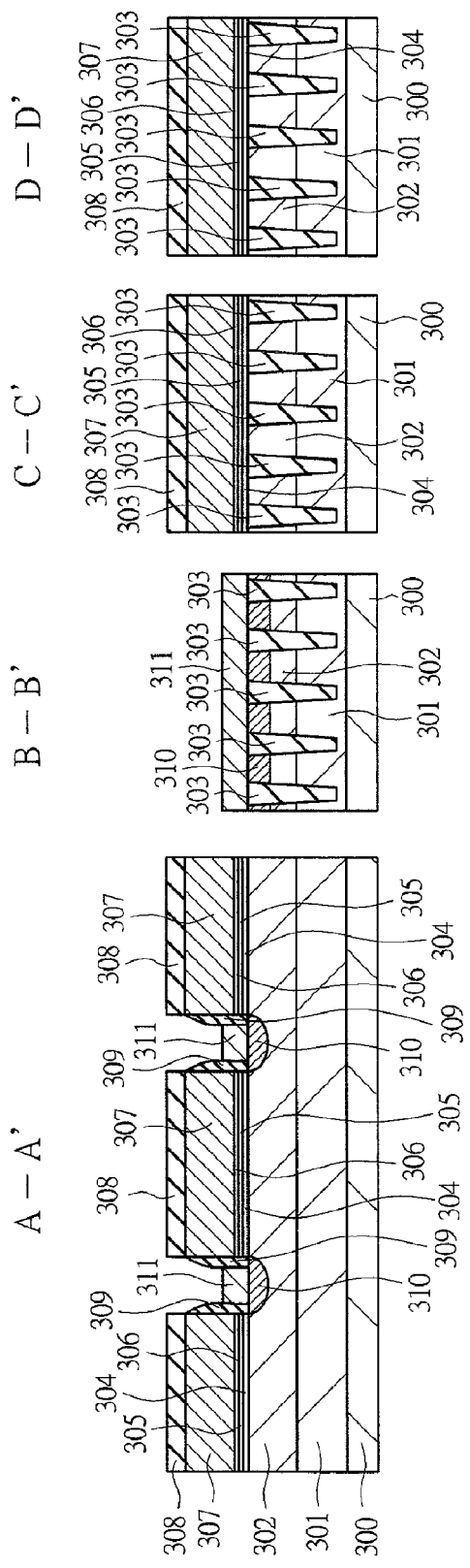
FIG. 26 is a cross-sectional view showing the method of manufacturing the nonvolatile semiconductor memory device continued from FIG. 25.

First, in the same manner as in the steps until FIG. 9 of the above first embodiment, the silicon oxide film 303 to constitute an isolation by STI is formed. Next, the silicon oxide film 304 is formed by a thermal oxidation method, and the silicon nitride film 305 to become a charge accumulation film is deposited, and the part thereof is thermally oxidized, thereby forming the silicon oxide film 306. Thereafter, the polysilicon film 307 and a silicon oxide film 308 to become the memory gate are deposited sequentially, and a region to become the drain diffusion layer later is removed by etching. Thereafter, sidewalls of the silicon oxide films 309 are formed, and the n$^+$ type semiconductor region 310 to become the drain diffusion layer is formed by ion implantation (FIG. 25). Thereafter, the n$^+$ type semiconductor region 310 is completely exposed to the surface by cleaning, and a polysilicon film 311 to connect adjacent active regions is deposited, and the polysilicon film 311 is left only between adjacent memory gates by, for example, an etch-back method (FIG. 26).

Figure 27:
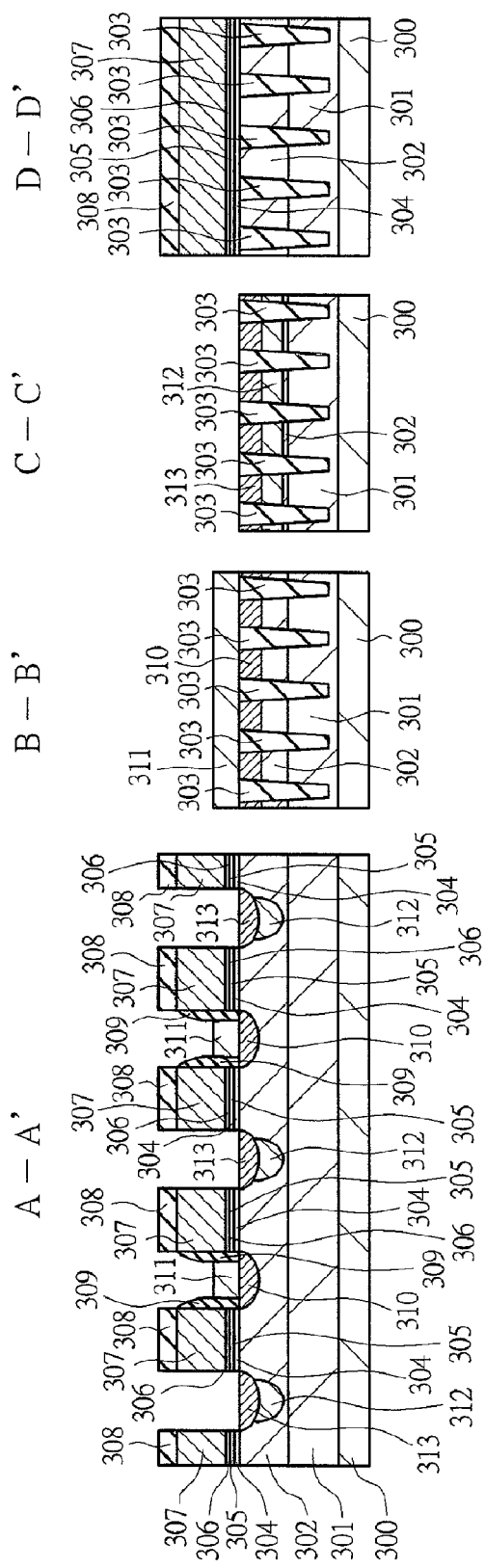
FIG. 27 is a cross-sectional view showing the method of manufacturing the nonvolatile semiconductor memory device continued from FIG. 26.
Figure 28:
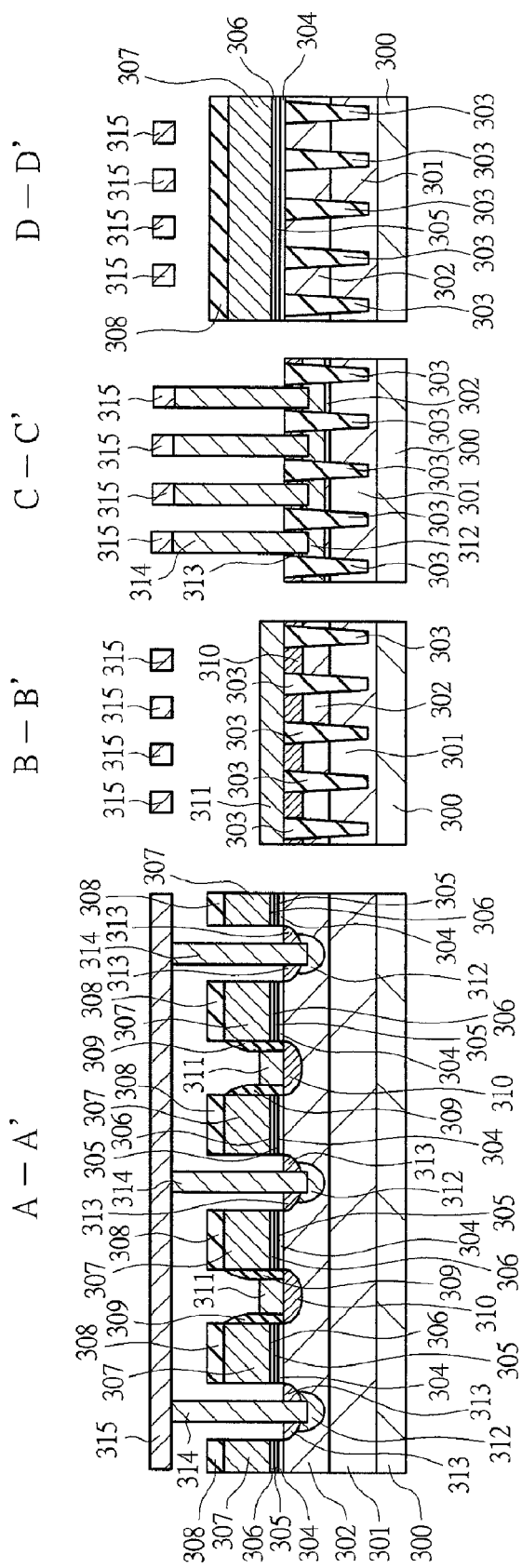
FIG. 28 is a cross-sectional view showing the method of manufacturing the nonvolatile semiconductor memory device continued from FIG. 27.
Figure 31:
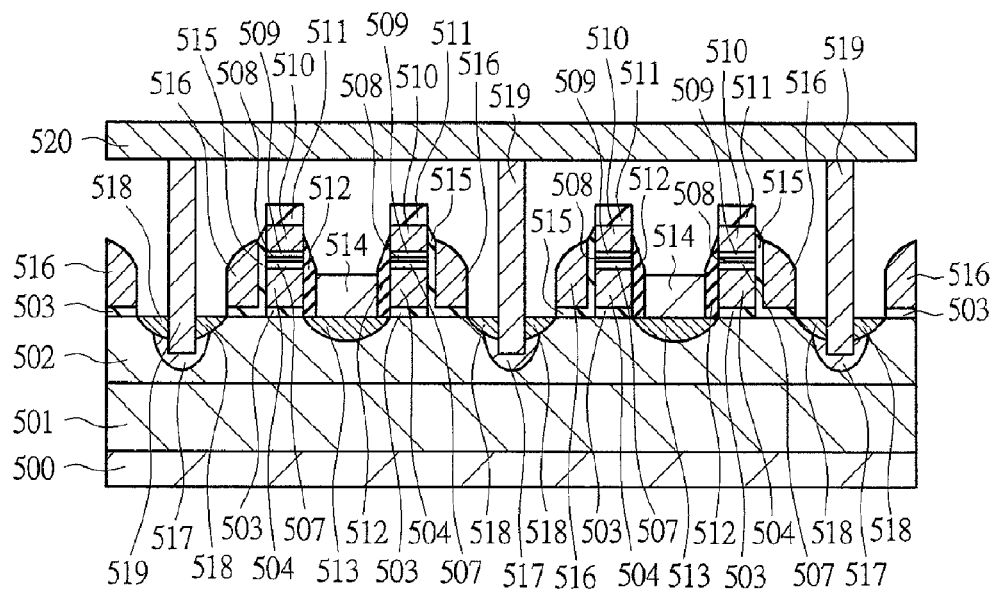
FIG. 31 is a cross-sectional view of a nonvolatile semiconductor memory device according to a fifth embodiment taken along the A-A' line of FIG. 2.
Figure 32:
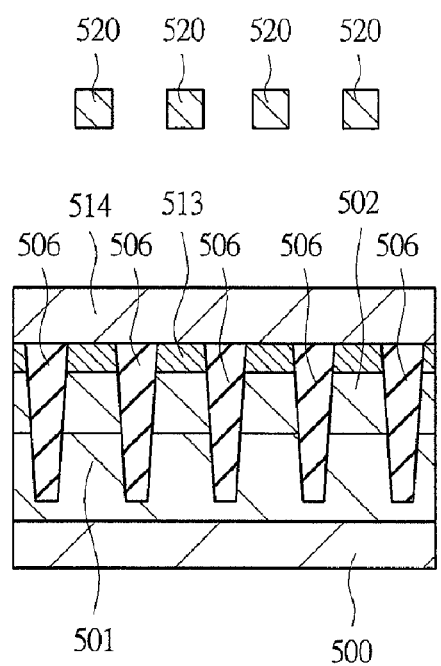
FIG. 32 is a cross-sectional view of the nonvolatile semiconductor memory device according to the fifth embodiment taken along the B-B' line of FIG. 2.
Figure 33:
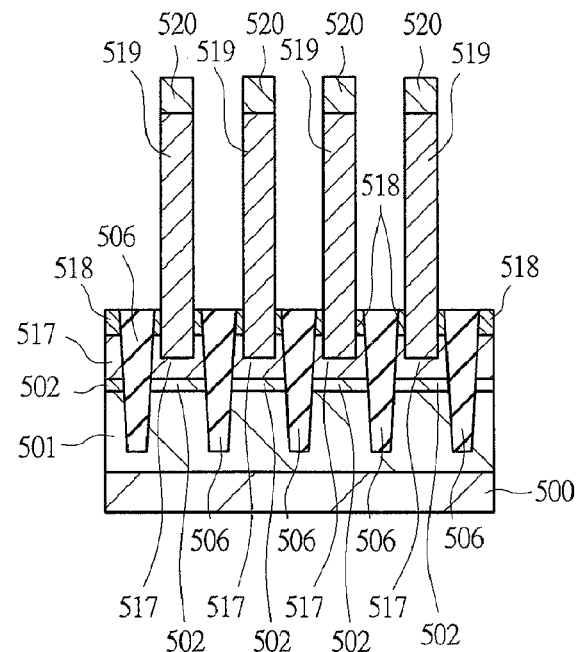
FIG. 33 is a cross-sectional view of the nonvolatile semiconductor memory device according to the fifth embodiment taken along the C-C' line of FIG. 2.
Figure 34:
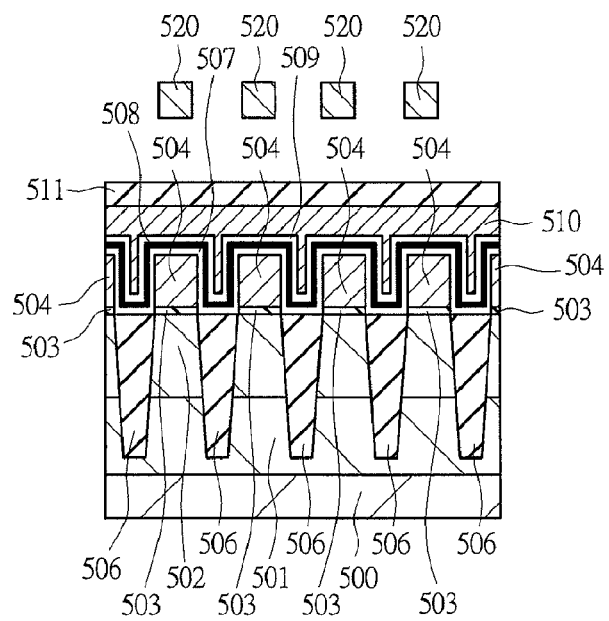
FIG. 34 is a cross-sectional view of the nonvolatile semiconductor memory device according to the fifth embodiment taken along the D-D' line of FIG. 2.

Next, by lithography and etching technology, the memory gate is processed. In addition, the memory gate 307, and the polysilicon film 311 may be silicided to reduce each resistance after removing the silicon oxide film 308 on the memory gate after the processing on the memory gate. Thereafter, the p$^+$ type semiconductor region 312 to become the voltage applied area of the well contact and the n$^+$ type semiconductor region 313 to become the source diffusion layer are formed by ion implantation (FIG. 27). After the silicon oxide film and the like between the contact layers are deposited, the contact 314 to supply power to the well and the source diffusion layer is processed to penetrate through to the p$^+$ type semiconductor region 312, and the p$^+$ type semiconductor region 312 and the n$^+$ type semiconductor region 313 are silicided, and the contact 314 is then formed. Thereafter, a metal film is deposited and patterned to be made into the metal wiring 315 so that the nonvolatile semiconductor memory device is completed (FIG. 28).

In the nonvolatile semiconductor memory device manufactured through the above process, since the contact to supply power to the source diffusion layer and the well is used in common for each bit line, there is no need to form another contact hole for the well separately, and in comparison with the prior art, it is possible to reduce the layout area. Furthermore, since power can be supplied from the contact of each memory cell to the well, even if the active width is reduced by the reduction of memory cell size and the well resistance is increased, it is possible to supply power to the well adequately.

Next, an example of the applied voltage conditions at the time of reading, erasing, and programming operations in the memory cell array according to the third embodiment is shown in a table of FIG. 29, and the respective operations are explained with reference to a circuit diagram of FIG. 24. It is assumed that the Cell shown in FIG. 24 is the selected cell. 1.5V is always applied onto the n type semiconductor region 301 during the memory cell operations.

In the reading operation of the memory cell, as shown in FIG. 29, a read voltage Vread is applied to the wiring MG2, and 1.5V is applied to the wirings Drain1 and Drain2, and 0V is applied to the wiring Source&well3, so that the threshold value of the memory cell is determined. At this time, 0V is applied to wirings MG1, MG3, and MG4. In addition, 1.5V is applied to the wirings Source&well1, Source&well2, and Source&well4 which are unselected bit lines. Since the potential difference between the source and the drain of the unselected bit lines is 0V under this condition, it is possible to completely suppress the leakage current of the reading operation. In addition, in the unselected cells of the selected bit line, the off-leakage current is controlled by applying 0V to the wiring MG.

The erase operation is performed per bit line, and the plurality of cells are erased at the same time. As the voltage condition, −6V is applied to wirings MG1 to MG4, and 6V is applied to the wirings Drain1 and Drain2. 0V is applied to the wiring Source&well3 which is the selected bit line. Note that, under the condition mentioned above, while only the wiring Source&well3 is applied 0V to be made into the selected state, by applying the selection voltage to the plurality of wirings Source&wells, it is possible to make the erasing unit further larger, and also it is possible to improve the throughput of the erase operation.

Further, by applying 1.5V to the wirings Source&well1, Source&well2, and Source&well4 which are unselected bit lines, it is possible to make the potential difference between the drain and the well small in comparison with a selected bit line, and it is possible to reduce the miss-erase to the cell connected to the unselected bit lines at the time of the erase operation. In addition, since the leakage current flowing in the unselected cell can be decreased, it is possible to lower the power supply necessary for the erase operation and reduce the chip area.

In the programming operation, 5V is applied to the wiring MG2, 5V is applied to the wirings Drain1 and Drain2, and 0.5V is applied to the wiring Source&well3. Under this voltage condition, since a large current flows into the channel of the selected cell Cell, the electronic energy of the current flowing through the channel increases, and a part thereof is injected into the charge accumulation film at the drain diffusion layer side (channel hot electron programming system), and the threshold value of the memory cell increases. But, under the condition mentioned above, only the wiring Source&well3 is applied 0.5V to be made into the selected state, but by applying the selection voltage to the plurality of wirings Source&wells, it is possible to program the memory cells in parallel, and also it is possible to improve the throughput of the programming operation.

As mentioned above, in the nonvolatile semiconductor memory device disclosed in the third embodiment, the same effects as in the first embodiment can be obtained.

Fourth Embodiment

Differences between a fourth embodiment and the third embodiment lie in the programming operation and the erase operation of the memory cell; and while the channel hot electron programming/band-to-band tunneling inducted hot hole erase have been carried out in the third embodiment, the programming operation and the erase operation are carried out by the F-N (Fowler-Nordheim) tunneling in the fourth embodiment. The circuit diagram and the method of manufacturing are same as those in the third embodiment.

The memory cell operation voltage conditions of the fourth embodiment are shown in FIG. 30. Herein, the case to erase bit lines one after another in the same manner as in the third embodiment will be described as an example, and the erase selected bit line is assumed to be the Source&well3 in the circuit diagram shown in FIG. 24, and the program selected cell is assumed to be the Cell of FIG. 24.

At the time of the erase operation, 1.5V is applied to the wiring Source&well3 which is the selected bit line, and 0V is applied to other unselected bit lines (wirings Source&well1, Source&well2, and Source&well4). In addition, 1.5 v is applied to the wiring Drain1 and Drain2. When −8.5V is applied to all the wiring MG in this state, in the cell arranged on the selected bit line (selected cell Cell), a potential difference of (−8.5V)−(1.5V)=−10V occurs, meanwhile, in the cell of the unselected bit line, only a potential difference of (−8.5V)−(0V)=−8.5V occurs.

At the time of the programming operation, 0V is applied to the wiring Source&well3, and 1.5V is applied to other unselected bit lines, and the wirings Drain1 and Drain2 are made to be OPEN. In addition, 10V is applied to the wiring MG2, and 0V is applied to the wirings MG1, MG3, and MG4. Under this voltage condition, in the program selected cell Cell, a potential difference of 10V−0V=10V occurs, meanwhile, in the programming unselected cell, only a potential difference of 10V−1.5V=8.5V, or 0V−0V=0V that is smaller than the potential difference occurs. As a result, the same effects as those in the first embodiment are obtained with the nonvolatile semiconductor memory device disclosed in the fourth embodiment.

In addition, while the example in which the number of the erase selected bit lines is one is shown in the fourth embodiment, the plurality of bit lines may be erased at the same time as a selection condition.

Fifth Embodiment

In a fifth embodiment, the case where the constitution of the present invention is applied to a memory cell of a split gate type in which charges are accumulated to a floating gate will be described. The plan view showing an example of a nonvolatile semiconductor memory device according to the fifth embodiment is same as that of FIG. 2, and the equivalent circuit diagram is same as that of FIG. 7. FIG. 31 to FIG. 34 are cross-sectional views of a semiconductor substrate taken along the A-A' line, B-B' line, C-C' line, and D-D' line in FIG. 2, respectively.

The plurality of memory cells of the present embodiment are configured by an field effect transistor having a p type semiconductor region 502 constituting the well, a floating gate (polysilicon film 504) arranged on the upper part of the p type semiconductor region 502 through a gate insulating film (silicon oxide film 503), an n$^+$ type semiconductor region 513 and an n$^+$ type semiconductor region 518 that are arranged in the well (p type semiconductor region 502) to sandwich the channel region of the bottom floating gate and constitute the drain/source of the memory cells.

The memory cell of the present embodiment has an n type semiconductor region 501 formed on a main surface of a silicon substrate 500; the p type semiconductor region 502 to become a well formed on the upper part of the p type semiconductor region 501; the floating gate 504; a control gate 510, and a select gate 516. The p type semiconductor region 502 is isolated by a silicon oxide film 506 and an n type semiconductor region 501 into each active region. In addition, the n type semiconductor region 501 is formed to reach the lower part of the silicon oxide film 506.

In addition, the memory cell is configured by: the floating gate 504 arranged on the well (p type semiconductor region 502) through the gate insulating film (silicon oxide film 503); the select gate 516 arranged on the p type semiconductor region 502 through the silicon oxide film 515 and also arranged adjacent to the floating gate 504 interposing the silicon oxide film 515; and the control gate 510 arranged on the floating gate 504 interposing a gate-to-gate insulating film (ONO film). The memory cell is configured by a drain diffusion layer ($n^+$ type semiconductor region 513) arranged on the well (p type semiconductor region 502) under the sidewall of the floating gate 504, and a source diffusion layer ($n^+$ type semiconductor region 518) arranged on the well (p type semiconductor region 502) under the sidewall of the select gate 516. In addition, the silicon oxide film 515 constituting the gate insulating film is arranged along the sidewall of the floating gate 504 and the p type semiconductor region 502.

The floating gate 504 and the p type semiconductor region 502 are insulated by the silicon oxide film 503. The floating gate 504 and the control gate 510 are insulated by the gate-to-gate insulating film (ONO film) formed of the silicon oxide film 507, the silicon nitride film 508, and the silicon oxide film 509. The select gate 516 and the p type semiconductor region 502 are insulated by the silicon oxide film 515.

The $n^+$ type semiconductor region 513 to become the drain diffusion layer is electrically connected to the drain diffusion layer region of the adjacent bit line by the polysilicon film 514 formed on the upper part of the semiconductor region. In addition, the $n^+$ type semiconductor region 518 to become the source diffusion layer is connected to the source diffusion layer of the memory cell connected in the same active region by the contact 519 and the metal wiring 520. The contact 519 is formed so as to penetrate through to the $p^+$ type semiconductor region 517 formed in the lower part of the $n^+$ type semiconductor region 518, and it supplies power to the p type semiconductor region 502 to become a well through the $p^+$ type semiconductor region 517.

In addition, the select gate 516 is connected in the row direction (X direction) to form a word line. The control gate 510 is connected in the row direction in parallel to the select gate. The metal wiring 520 to become the bit line is arranged to extend in the column direction (Y direction) perpendicular to the word line, and constitute a memory cell array.

FIG. 35 to FIG. 41 are cross-sectional views simply showing a method of manufacturing the nonvolatile semiconductor memory device according to the fifth embodiment.

Figure 35:
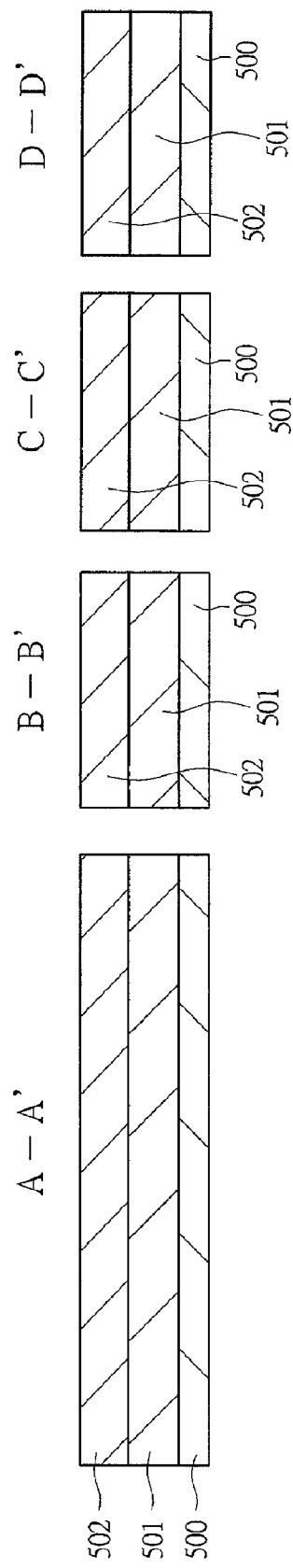
FIG. 35 is a cross-sectional view showing a method of manufacturing a memory cell region of the nonvolatile semiconductor memory device according to the fifth embodiment.
Figure 36:
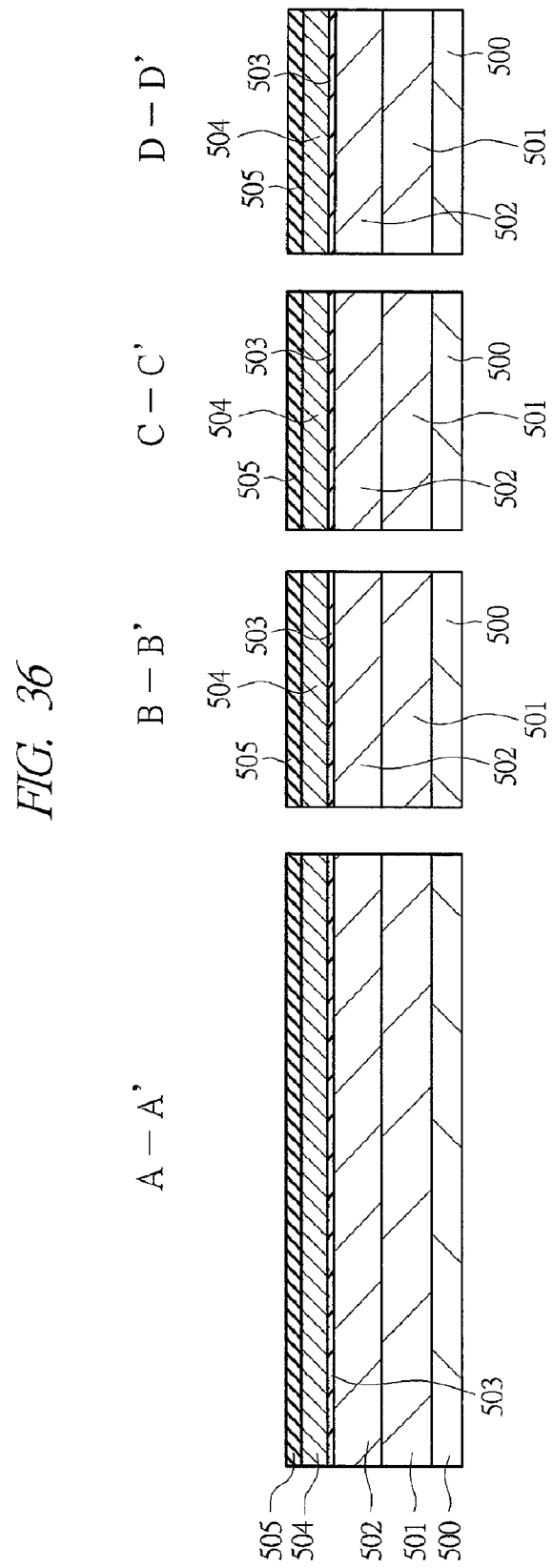
FIG. 36 is a cross-sectional view showing the method of manufacturing the nonvolatile semiconductor memory device continued from FIG. 35.
Figure 37:
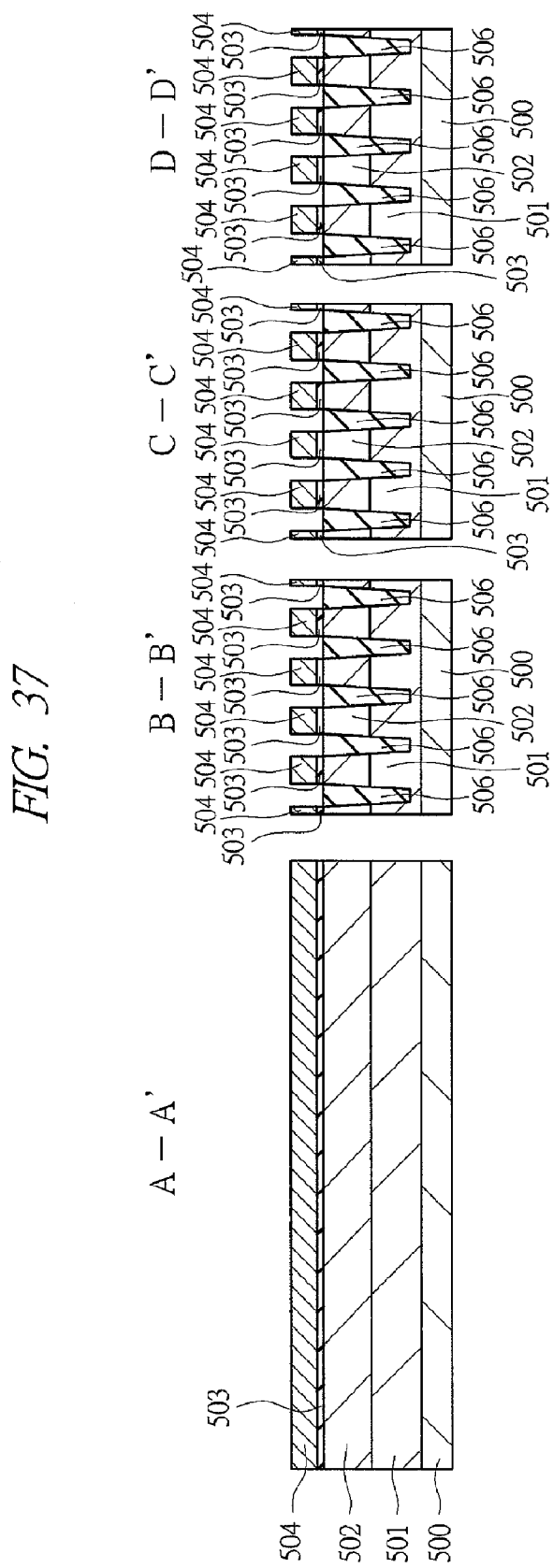
FIG. 37 is a cross-sectional view showing the method of manufacturing the nonvolatile semiconductor memory device continued from FIG. 36.

First, the n type semiconductor region 501 and the p type semiconductor region 502 to become the wells are formed on the silicon substrate 500 by lithography and ion implantation technology (FIG. 35). Thereafter, as shown in FIG. 36, the silicon oxide film 503 insulating the floating gate and the p type semiconductor region 502 is formed by a thermal oxidation method, and the polysilicon film 504 to become the floating gate and the silicon nitride film 505 are deposited by a CVD method sequentially, and the silicon oxide film 506 to become an isolation (STI) is formed by lithography, dry etching and CMP technology, and the silicon nitride film 505 is removed (FIG. 37).

Figure 38:
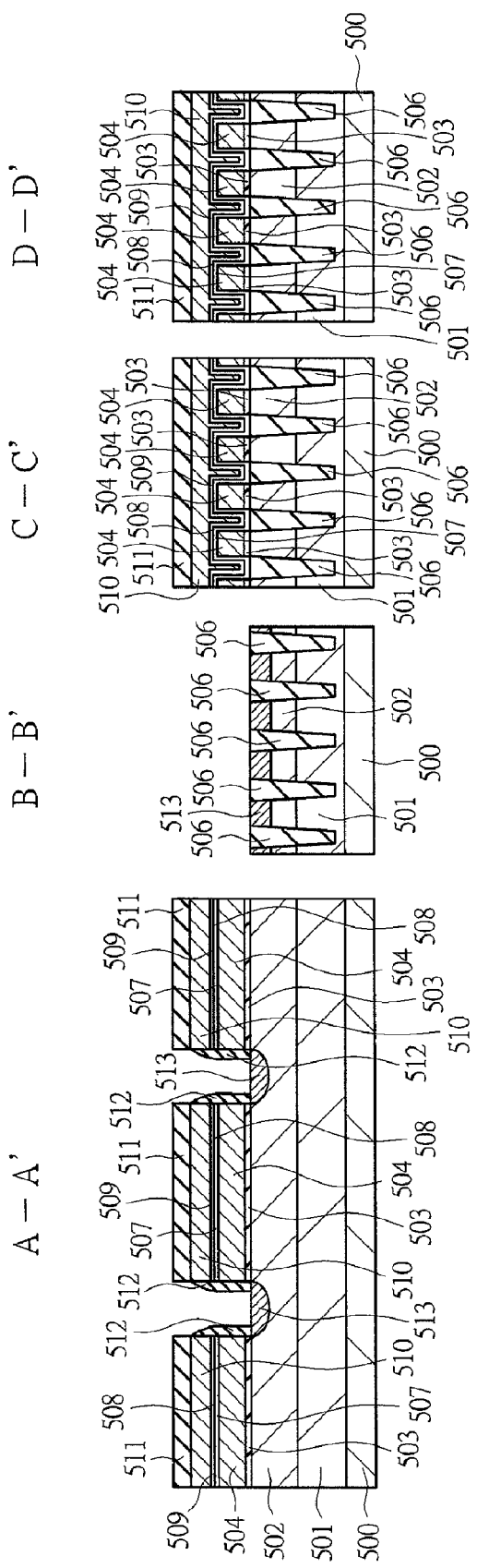
FIG. 38 is a cross-sectional view showing the method of manufacturing the nonvolatile semiconductor memory device continued from FIG. 37.
Figure 39:
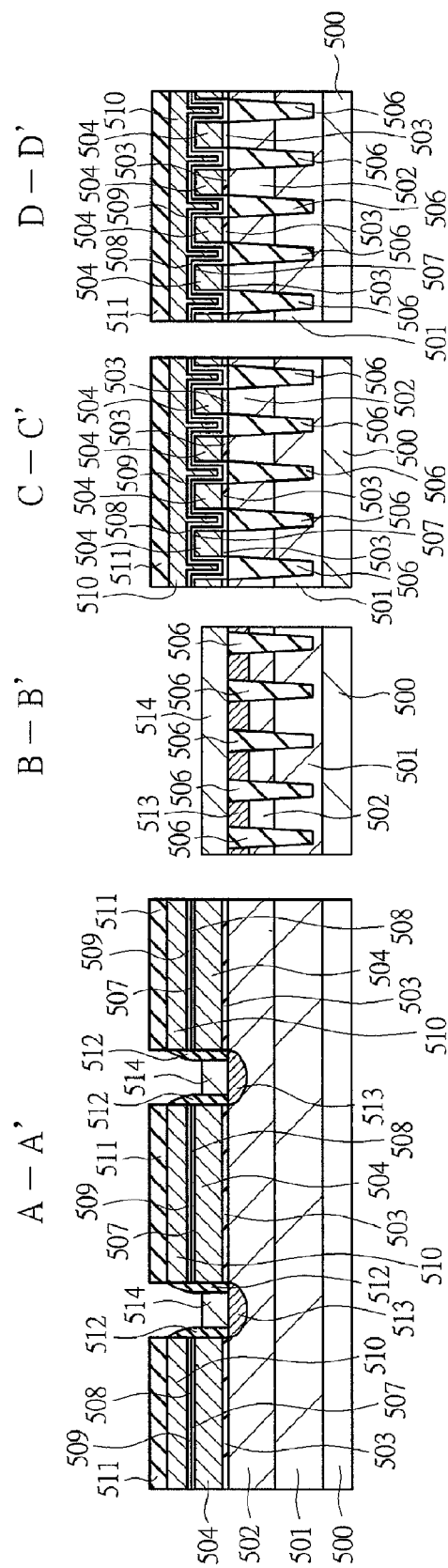
FIG. 39 is a cross-sectional view showing the method of manufacturing the nonvolatile semiconductor memory device continued from FIG. 38.

Next, the silicon oxide film 507, the silicon nitride film 508, and the silicon oxide film 509 to become an interlayer insulating film insulating the floating gate and the control gate are deposited sequentially, and the polysilicon film 510 and the silicon oxide film 511 to become the control gate are deposited thereon, and the region to become the drain diffusion layer later is etched to be removed. Thereafter, the sidewall of the silicon oxide film is formed, and the $n^+$ type semiconductor region 513 to become the drain diffusion layer is formed by ion implantation (FIG. 38). The $n^+$ type semiconductor region 513 is completely exposed to the surface by cleaning, and the polysilicon film 514 for connecting adjacent active regions is deposited, and the polysilicon film 514 is left only between the adjacent memory gates by, for example, an etch-back method (FIG. 39).

Figure 40:
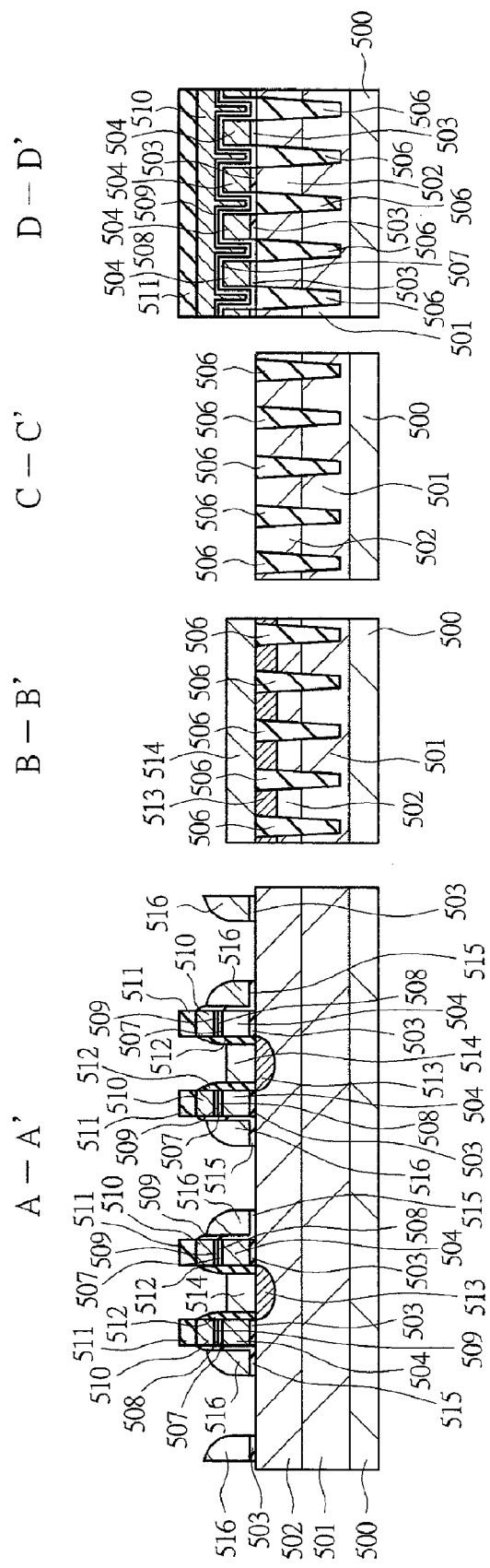
FIG. 40 is a cross-sectional view showing the method of manufacturing the nonvolatile semiconductor memory device continued from FIG. 39.
Figure 41:
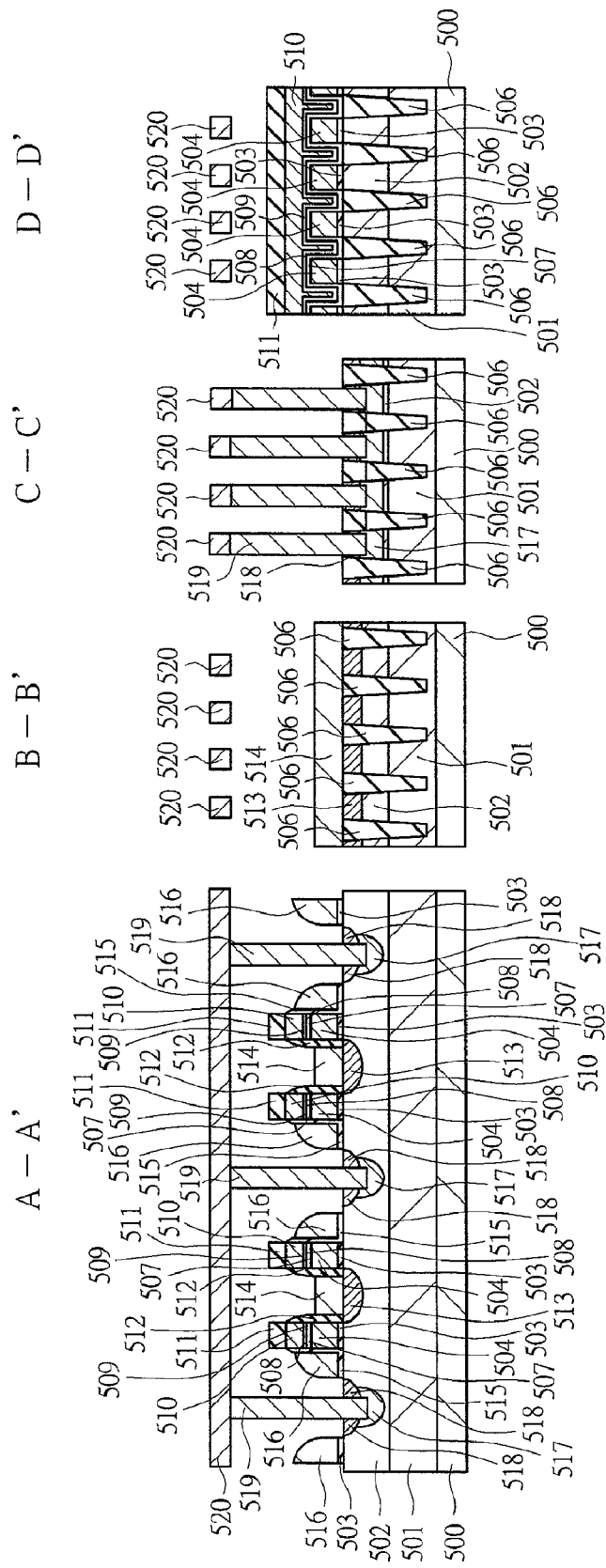
FIG. 41 is a cross-sectional view showing the method of manufacturing the nonvolatile semiconductor memory device continued from FIG. 40.
Figure 42:
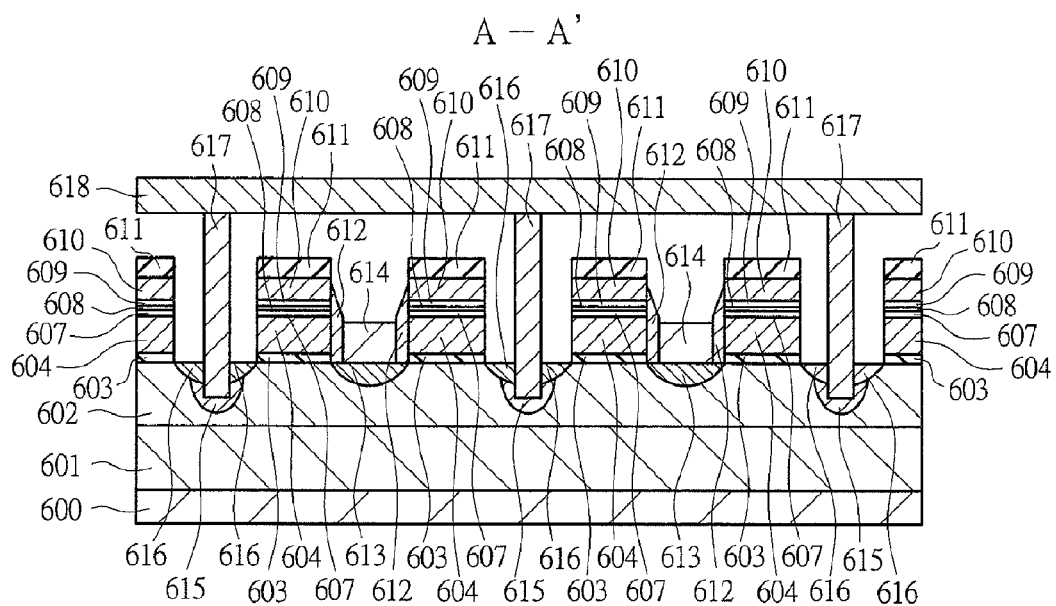
FIG. 42 is a cross-sectional view of a nonvolatile semiconductor memory device according to a sixth embodiment taken along the A-A' line of FIG. 19.
Figure 43:
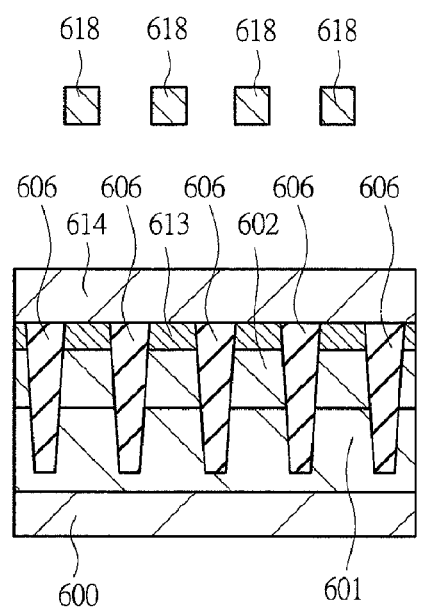
FIG. 43 is a cross-sectional view of the nonvolatile semiconductor memory device according to the sixth embodiment taken along the B-B' line of FIG. 19.
Figure 44:
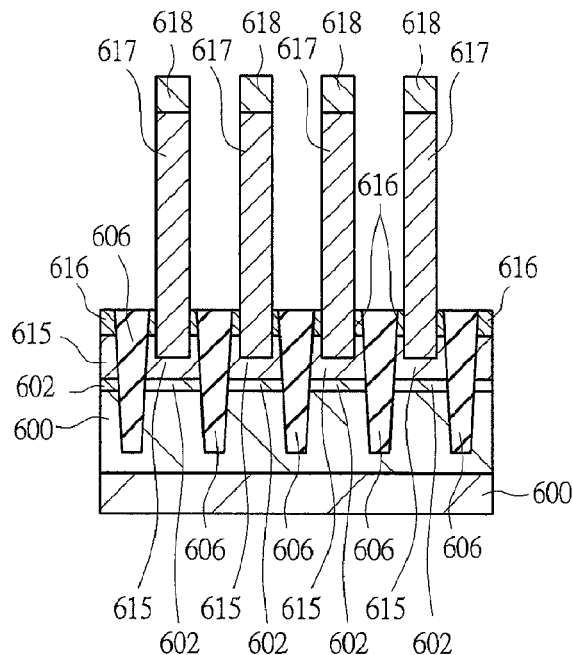
FIG. 44 is a cross-sectional view of the nonvolatile semiconductor memory device according to the sixth embodiment taken along the C-C' line of FIG. 19.
Figure 45:
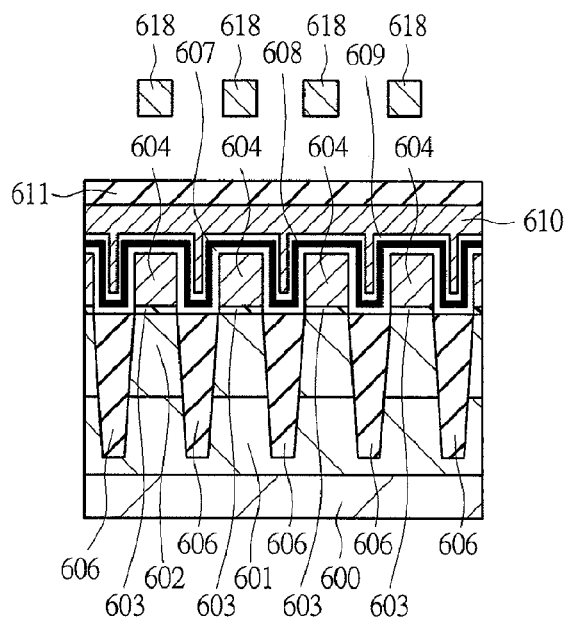
FIG. 45 is a cross-sectional view of the nonvolatile semiconductor memory device according to the sixth embodiment taken along the D-D' line of FIG. 19.

Next, the control gate and the floating gate are processed by lithography and etching technology. Thereafter, the silicon oxide film 515 to insulate the select gate from the surrounding gates and the p type semiconductor region 502 is formed, and the polysilicon film 516 to become the select gate is deposited and the select gate is formed by processing the sidewalls (FIG. 40). Thereafter, a $p^+$ type semiconductor region 517 to become the voltage applied area of the well contact and an $n^+$ type semiconductor region 518 to become the source diffusion layer are formed by ion implantation. After the silicon oxide film and the like between the contact layers are deposited, a contact 519 to supply electricity to the well and the source diffusion layer is processed to penetrate through to the $p^+$ type semiconductor region 517, and the $p^+$ type semiconductor region 517 and the $n^+$ type semiconductor region 518 are silicided, and the contact is then formed. Thereafter, a metal film is deposited, and patterned to be made into a metal wiring 520, thereby completing the nonvolatile semiconductor memory device (FIG. 41).

In the nonvolatile semiconductor memory device manufactured through the above processes, because the contact to supply electricity to the source diffusion layer and the well is used in common for each bit line, there is no need to form another contact hole for the well separately, and it is possible to reduce the layout area in comparison with the prior art. Furthermore, since power can be supplied from the contact of each memory cell to the well, even if the active width is reduced by the reduction of memory cell size and the well resistance is increased, it is possible to supply power to the well. The operation conditions of the memory cell array according to the fifth embodiment are same as those in the first and second embodiments.

In the nonvolatile semiconductor memory device disclosed in the fifth embodiment, it is possible to supply power to the wells isolated for each bit line without increasing the layout area, and reduce the disturbances of the unselected cells. Furthermore, because the leakage current in the unselected cells can be reduced at the time of the erase operation, it is possible to reduce the necessary power source area so that the chip area is reduced.

Sixth Embodiment

In a sixth embodiment, a case where the constitution of the present invention is applied to a one-transistor type memory cell that accumulates charges to the floating gate will be described. The plan view showing an example of a nonvolatile semiconductor memory device according to the sixth embodiment is same as that of FIG. 19, and the equivalent circuit diagram is same as that of FIG. 24. FIG. 42 to FIG. 45 are cross-sectional views of a semiconductor substrate taken along the A-A' line, B-B' line, C-C' line, and D-D' line in FIG. 19, respectively.

The plurality of memory cells of the present embodiment are configured by an field effect transistor having: a p type semiconductor region 602 constituting the well; a floating gate (polysilicon film) 604 arranged on an upper portion of the p type semiconductor region 602 interposing a gate insulating film (silicon oxide film 603); and an n+ type semiconductor region 613 and an n+ type semiconductor region 616 that are arranged in the well (p type semiconductor region 602) to sandwich the channel region at the bottom of the floating gate and constitute the drain/source of the memory cells.

The memory cell of the present embodiment includes: an n type semiconductor region 601 formed on a main surface of a silicon substrate 600; the p type semiconductor region 602 to become a well formed on the upper part of the p type semiconductor region 602; the floating gate 604; and a control gate 610. The p type semiconductor region 602 is isolated by a silicon oxide film 606 and an n type semiconductor region 601 into each active region. In addition, the n type semiconductor region 601 is formed to reach the lower part of the silicon oxide film 606.

This memory cell is configured by: the floating gate 604 arranged in the well (p type semiconductor region 602) interposing the silicon oxide film 603; the control gate 610 arranged on the floating gate 604 interposing a gate-to-gate insulating film (ONO film); a drain diffusion layer (n+ type semiconductor region 613) arranged at one side of the sidewalls of the floating gate 604; and a source diffusion layer (n+ type semiconductor region 616) arranged in the well (p type semiconductor region 602) at the other side of the sidewalls of the floating gate 604.

The floating gate 604 and the p type semiconductor region 602 are insulated by the silicon oxide film 603. The floating gate 604 and the control gate 610 are insulated by a gate-to-gate insulating film (ONO film) consisting of a silicon oxide film 607, a silicon nitride film 608, and a silicon oxide film 609.

The n+ type semiconductor region 613 to become the drain diffusion layer is electrically connected to a drain diffusion layer region of the adjacent bit line by a polysilicon film 614 formed on the upper part of the semiconductor region. In addition, the n+ type semiconductor region 616 to become the source diffusion layer is connected to the source diffusion layer of the memory cell connected in the same active region by a contact 617 and a metal wiring 618. The contact 617 is formed so as to penetrate through to the p+ type semiconductor region 615 formed on the lower part of the n+ type semiconductor region 616, and supplies power to the p type semiconductor region 602 to become a well through the p+ type semiconductor region.

In addition, the control gate 610 is connected to the row direction to form a word line. The metal wiring 618 to become the bit line is arranged to extend in the column direction perpendicular to the word line, and constitutes memory cell array.

Figure 46:
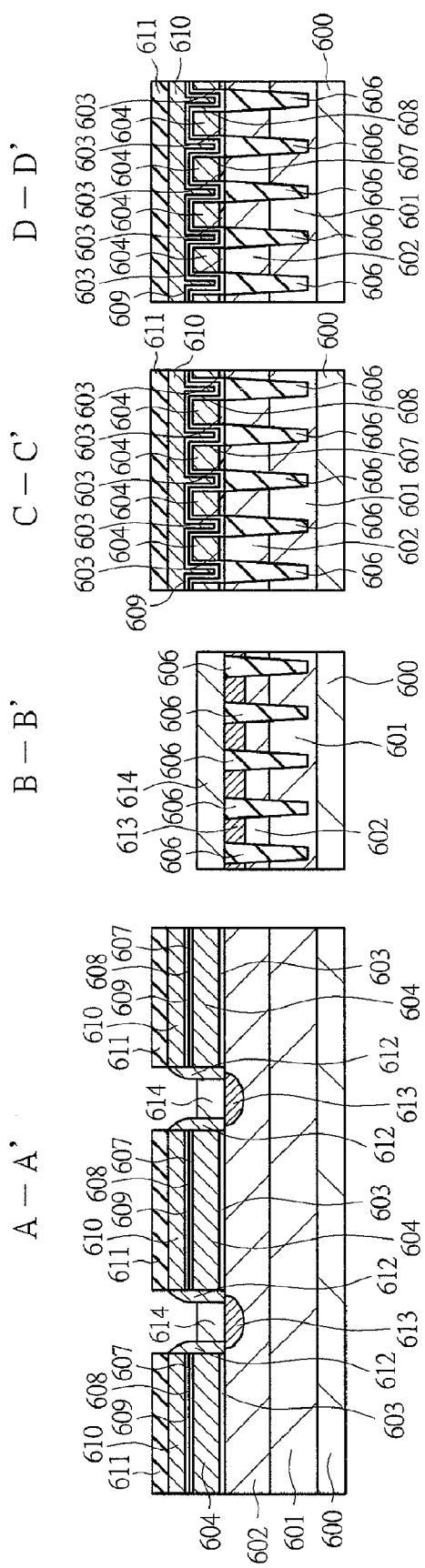
FIG. 46 is a cross-sectional view showing a method of manufacturing a memory cell region of the nonvolatile semiconductor memory device according to the sixth embodiment.
Figure 47:
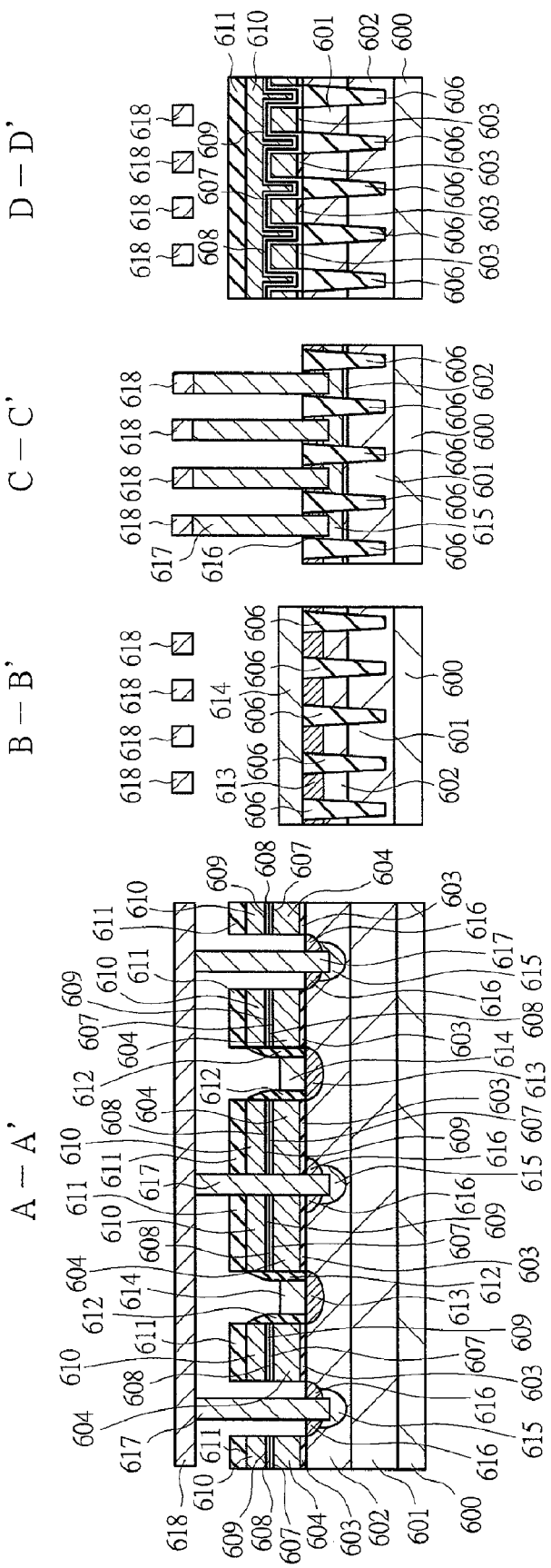
FIG. 47 is a cross-sectional view showing the method of manufacturing the nonvolatile semiconductor memory device continued from FIG. 46.

FIG. 46 to FIG. 47 are simplified cross-sectional views partly showing a method of manufacturing the nonvolatile semiconductor memory device according to the sixth embodiment.

The process is carried out by FIG. 46 by the same process as that in FIG. 39 in the above fifth embodiment. By lithography and etching technology, the control gate and the floating gate are processed. Thereafter, a p+ type semiconductor region 615 to become the voltage applied area of the well contact and an n+ type semiconductor region 616 to become the source diffusion layer are formed by ion implantation.

After the silicon oxide film and the like between the contact layers are deposited, a contact 617 to supply power to the well and the source diffusion layer is processed to penetrate through to the p+ type semiconductor region 615. And, after the p type semiconductor region 615 and the n+ type semiconductor region 616 are silicided, the contact is formed. Thereafter, a metal film is deposited, and patterned to be made into a metal wiring 618, thereby completing a nonvolatile semiconductor memory device (FIG. 47).

In the nonvolatile semiconductor memory device manufactured through the above process, since the contact to supply power to the source diffusion layer and the well is used in common for each bit line, there is no need to form another contact hole for the well separately, and it is possible to reduce the layout area in comparison with the prior art. Furthermore, because power can be supplied from the contact of each memory cell to the well, even if the active width is reduced by the reduction of memory cell size and the well resistance is increased, it is possible to supply power to the well. The operation conditions of the memory cell array according to the sixth embodiment are same as those in the third and fourth embodiments.

In the nonvolatile semiconductor memory device disclosed in the sixth embodiment, the same effects as those in the fifth embodiment are obtained.

Seventh Embodiment

The difference between the above-described first and second embodiments and the present embodiment lies in the isolation methods of the well, and while the well is isolated for each bit line by the well structure in the above-described first and second embodiments, the well is isolated by an SOI (Silicon On Insulator) structure in the present embodiment.

Figure 48:
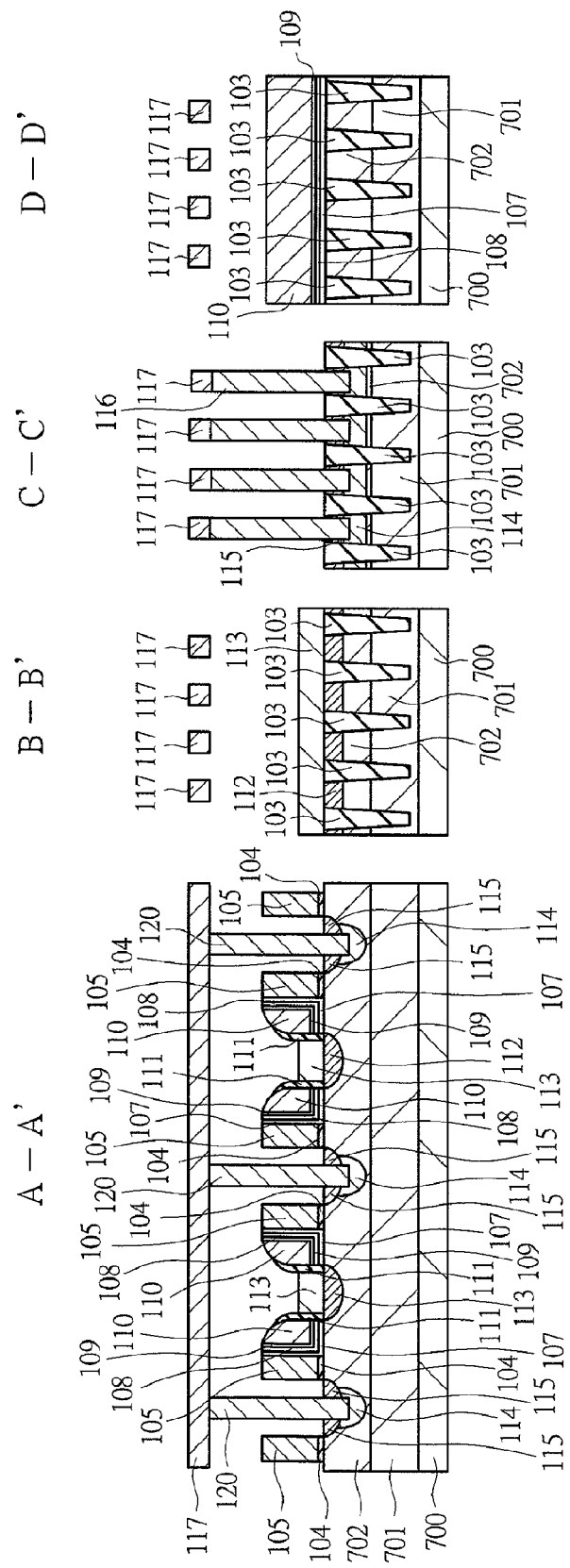
FIG. 48 is a plan view of main parts showing a memory cell of a nonvolatile semiconductor memory device according to a seventh embodiment.

FIG. 48 shows a cross-sectional view of a nonvolatile semiconductor memory device according to the seventh embodiment. The semiconductor substrate used in the present embodiment is an SOI board, and an SOI layer 702 is arranged on a silicon oxide film 701 with a silicon substrate 700 as a base material. To this SOI layer 702, a well (a p type semiconductor region) is formed. In the present embodiment, the silicon oxide film 701 is used in place of the n type semiconductor region 101 shown in the above-described first embodiment, and thus it is possible to prevent leakage current.

In addition, a method of manufacturing the nonvolatile semiconductor memory device according to the present embodiment is similar to the above-described first and second embodiments except that the silicon oxide film 701 of the SOI substrate is formed instead of forming the n type semiconductor region 101 in FIG. 8. In the memory cell shown in FIG. 48, the same effects are obtained by operating the memory cell by the voltage condition described in the above first and second embodiments.

As mentioned above, while the well is isolated by the SOI structure on the contrary to the memory cell according to the above first and second embodiments in the present embodiment, it is needles to say that, in the same manner, the same effects as those in the respective embodiments can be obtained by isolating the well by the SOI structure in place of the well structure with respect to the memory cells and the operation voltage conditions described in the third to sixth embodiments.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, while the case where a plurality of memory cells are formed in the active regions of the form of plane stripes has been described in the above embodiment, if a common contact electrically connected to the source diffusion layer and the well can be provided in each memory cell, it can be applied to the active region in a form of a plane rectangle.

The present invention can be used widely in the manufacturing industry of manufacturing nonvolatile semiconductor memory devices.

What is claimed is:

1. A method of manufacturing a nonvolatile semiconductor memory device comprising the steps of:
    (a) forming a first semiconductor region of a first conductivity type constituting a well on a main surface of a semiconductor substrate having a first direction and a second direction intersecting the first direction;
    (b) forming a gate conductive film to constitute a gate on the main surface of the semiconductor substrate interposing an insulating film, and patterning the gate conductive film so as to extend in the first direction after the step (a);
    (c) forming a second semiconductor region of a second conductivity type opposite the first conductivity type constituting a drain in the first semiconductor region under one side of sidewalls of the gate after the step (b);
    (d) forming a third semiconductor region of the second conductivity type constituting a source in the first semiconductor region under another side of the sidewalls of the gate after the step (b);
    (e) forming a hole penetrating through the third semiconductor region after the step (d); and
    (f) a step of burying a metal film in the hole to form a contact electrically connected to the third semiconductor region and the first semiconductor region,
wherein,
between the step (a) and the step (b), a plurality of isolations extending in the second direction are formed along the first direction and deeper than the first semiconductor region on the main surface of the semiconductor substrate,
after the step (c), a wiring conductive film to constitute a data line is formed on the main surface of the semiconductor substrate, and the wiring conductive film is patterned so as to extend in the first direction on the second semiconductor region and the isolation,
after step (a) and before step (d), a fourth semiconductor region of the first conductivity type whose impurity density is higher than that of the first semiconductor region is formed in the first semiconductor region, and
the hole reaches the fourth semiconductor region.

* * * * *